United States Patent
Spory

(10) Patent No.: US 10,128,161 B2
(45) Date of Patent: *Nov. 13, 2018

(54) 3D PRINTED HERMETIC PACKAGE ASSEMBLY AND METHOD

(71) Applicant: Erick Merle Spory, Colorado Springs, CO (US)

(72) Inventor: Erick Merle Spory, Colorado Springs, CO (US)

(73) Assignee: Global Circuit Innovations, Inc., Colorado Springs, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/792,225

(22) Filed: Oct. 24, 2017

(65) Prior Publication Data

US 2018/0053702 A1   Feb. 22, 2018

Related U.S. Application Data

(60) Continuation-in-part of application No. 14/142,823, filed on Dec. 28, 2013, which is a
(Continued)

(51) Int. Cl.
*H01L 21/00* (2006.01)
*H01L 23/20* (2006.01)
(Continued)

(52) U.S. Cl.
CPC .......... *H01L 23/20* (2013.01); *H01L 21/4803* (2013.01); *H01L 21/4817* (2013.01);
(Continued)

(58) Field of Classification Search
CPC ......... H01L 23/00; H01L 24/83; H01L 24/26; H01L 24/98; H01L 24/80
See application file for complete search history.

(56) References Cited

U.S. PATENT DOCUMENTS 4,012,832 A   3/1977   Crane
4,426,769 A   1/1984   Grabbe
(Continued)

FOREIGN PATENT DOCUMENTS

WO   WO2011-101272 A1   8/2011

OTHER PUBLICATIONS

Official Action for U.S. Appl. No. 13/623,603, dated Jan. 16, 2018.
(Continued)

*Primary Examiner* — Joseph C Nicely
*Assistant Examiner* — Wilner Jean Baptiste
(74) *Attorney, Agent, or Firm* — Thomas J. Lavan

(57) ABSTRACT

A method is provided. The method includes one or more of removing existing ball bonds from an extracted die, placing the extracted die into a recess of a hermetic substrate, the extracted die having a centered orientation in the recess, and applying a side fill compound into the recess between the extracted die and the hermetic substrate. The method also includes 3D printing, by a 3D printer, a plurality of bond connections between die pads of the extracted die and first bond pads of the hermetic substrate in order to create a 3D printed die substrate, and 3D printing a hermetic encapsulation over the die, the side fill compound, and the 3D printed bond connections in order to create a hermetic assembly. The extracted die includes a fully functional semiconductor die removed from a previous package. The hermetic substrate includes the first bond pads coupled to second bond pads.

20 Claims, 25 Drawing Sheets

Assembly Process for 3D Printed Hermetic Substrate

Related U.S. Application Data continuation-in-part of application No. 13/785,959, filed on Mar. 5, 2013, which is a continuation-in-part of application No. 13/623,603, filed on Sep. 20, 2012, which is a continuation of application No. 13/283,293, filed on Oct. 27, 2011, now abandoned, said application No. 15/792,225 is a continuation-in-part of application No. 14/600,733, filed on Jan. 20, 2015, now Pat. No. 9,824,948, which is a division of application No. 14/142,823, filed on Dec. 28, 2013, which is a continuation-in-part of application No. 13/785,959, filed on Mar. 5, 2013, which is a continuation-in-part of application No. 13/623,603, filed on Sep. 20, 2012, which is a continuation of application No. 13/283,293, filed on Oct. 27, 2011, now abandoned, said application No. 15/792,225 is a continuation-in-part of application No. 15/088,822, filed on Apr. 1, 2016, which is a continuation-in-part of application No. 13/623,603, filed on Sep. 20, 2012, which is a continuation of application No. 13/283,293, filed on Oct. 27, 2011, now abandoned.

(51) Int. Cl.

| | | |
|---|---|---|
| *H01L 23/00* | (2006.01) | |
| *H01L 21/48* | (2006.01) | |
| *H01L 23/04* | (2006.01) | |
| *H01L 23/495* | (2006.01) | |
| *H01L 23/498* | (2006.01) | |
| *H01L 21/50* | (2006.01) | |
| *H01L 23/26* | (2006.01) | |
| *H01L 23/10* | (2006.01) | |

(52) U.S. Cl.
CPC .............. *H01L 21/50* (2013.01); *H01L 23/04* (2013.01); *H01L 23/26* (2013.01); *H01L 23/49513* (2013.01); *H01L 23/49541* (2013.01); *H01L 23/49861* (2013.01); *H01L 24/24* (2013.01); *H01L 24/25* (2013.01); *H01L 24/27* (2013.01); *H01L 24/29* (2013.01); *H01L 24/32* (2013.01); *H01L 24/82* (2013.01); *H01L 24/83* (2013.01); *H01L 23/10* (2013.01); *H01L 23/564* (2013.01); *H01L 2224/245* (2013.01); *H01L 2224/24011* (2013.01); *H01L 2224/24051* (2013.01); *H01L 2224/24175* (2013.01); *H01L 2224/25171* (2013.01); *H01L 2224/2731* (2013.01); *H01L 2224/2919* (2013.01); *H01L 2224/29124* (2013.01); *H01L 2224/29144* (2013.01); *H01L 2224/29147* (2013.01); *H01L 2224/32225* (2013.01); *H01L 2224/32245* (2013.01); *H01L 2224/48* (2013.01); *H01L 2224/73267* (2013.01); *H01L 2224/82102* (2013.01); *H01L 2224/82103* (2013.01); *H01L 2224/82214* (2013.01); *H01L 2224/82815* (2013.01); *H01L 2224/838* (2013.01); *H01L 2224/8385* (2013.01); *H01L 2224/83192* (2013.01); *H01L 2224/92247* (2013.01); *H01L 2924/00* (2013.01); *H01L 2924/00014* (2013.01); *H01L 2924/00015* (2013.01); *H01L 2924/01013* (2013.01); *H01L 2924/01029* (2013.01); *H01L 2924/01047* (2013.01); *H01L 2924/01079* (2013.01); *H01L 2924/12042* (2013.01); *H01L 2924/14* (2013.01); *H01L 2924/157* (2013.01); *H01L 2924/15153* (2013.01); *H01L 2924/15787* (2013.01); *H01L 2924/15788* (2013.01); *H01L 2924/181* (2013.01); *H01L 2924/19107* (2013.01); *H01L 2924/3656* (2013.01); *H01L 2924/3861* (2013.01)

(56) References Cited

U.S. PATENT DOCUMENTS

| | | | |
|---|---|---|---|
| 4,622,433 A * | 11/1986 | Frampton | H01L 21/50 |
| | | | 174/521 |
| 5,064,782 A | 11/1991 | Nishiguchi | |
| 5,219,794 A | 6/1993 | Satoh | |
| 5,243,756 A | 9/1993 | Hamburgen et al. | |
| 5,517,127 A | 5/1996 | Bergeron | |
| 5,598,031 A | 1/1997 | Groover et al. | |
| 5,783,464 A | 7/1998 | Burns | |
| 5,783,868 A | 7/1998 | Galloway | |
| 5,847,467 A | 12/1998 | Wills | |
| 5,936,758 A | 8/1999 | Fisher et al. | |
| 6,100,108 A | 8/2000 | Mizuno et al. | |
| 6,100,581 A | 8/2000 | Wakefield et al. | |
| 6,169,331 B1 | 1/2001 | Manning | |
| 6,429,028 B1 | 8/2002 | Young | |
| 6,472,725 B1 | 10/2002 | Stroupe | |
| 7,067,332 B1 | 6/2006 | Chowdhury | |
| 7,160,368 B1 * | 1/2007 | Wakelin | B01J 20/041 |
| | | | 257/99 |
| 7,294,533 B2 | 11/2007 | Lebonheur | |
| 7,759,800 B2 | 7/2010 | Rigg et al. | |
| 7,883,880 B1 | 2/2011 | Davila et al. | |
| 8,421,227 B2 | 4/2013 | Lin | |
| 8,518,746 B2 * | 8/2013 | Pagaila | H01L 21/561 |
| | | | 438/107 |
| 8,822,274 B2 | 9/2014 | Suleiman | |
| 9,799,617 B1 * | 10/2017 | Curiel | H01L 24/03 |
| 9,870,968 B2 | 1/2018 | Spory | |
| 2001/0019176 A1 | 9/2001 | Ahiko et al. | |
| 2002/0084528 A1 | 7/2002 | Kim et al. | |
| 2002/0182782 A1 | 12/2002 | Farnworth | |
| 2003/0127423 A1 | 7/2003 | Dlugokecki | |
| 2004/0006150 A1 | 1/2004 | Murray et al. | |
| 2004/0040855 A1 | 3/2004 | Batinovich | |
| 2004/0056072 A1 | 3/2004 | Chapman et al. | |
| 2005/0057883 A1 | 3/2005 | Bolken | |
| 2005/0085578 A1 | 4/2005 | Iguchi | |
| 2005/0285250 A1 | 12/2005 | Jeong | |
| 2006/0068595 A1 | 3/2006 | Seliger et al. | |
| 2006/0166406 A1 | 7/2006 | Lin | |
| 2007/0007661 A1 | 1/2007 | Burgess | |
| 2007/0259470 A1 | 11/2007 | Quenzer et al. | |
| 2007/0295456 A1 | 12/2007 | Gudeman | |
| 2008/0124547 A1 | 5/2008 | O et al. | |
| 2008/0197469 A1 | 8/2008 | Yang et al. | |
| 2008/0230922 A1 | 9/2008 | Mochizuki | |
| 2009/0072413 A1 | 3/2009 | Mahler | |
| 2009/0085181 A1 | 4/2009 | Advincula, Jr. | |
| 2009/0151972 A1 | 6/2009 | Potter | |
| 2009/0160047 A1 | 6/2009 | Otsuka | |
| 2010/0007367 A1 | 1/2010 | Spielberger et al. | |
| 2010/0079035 A1 | 4/2010 | Matsuzawa et al. | |
| 2010/0140811 A1 | 6/2010 | Leal et al. | |
| 2010/0200262 A1 | 8/2010 | Mahapatra et al. | |
| 2010/0246152 A1 | 9/2010 | Lin et al. | |
| 2010/0314754 A1 | 12/2010 | Zhang | |
| 2011/0215449 A1 | 9/2011 | Camacho et al. | |
| 2011/0298137 A1 | 12/2011 | Pagaila et al. | |
| 2012/0061814 A1 | 3/2012 | Camacho et al. | |
| 2012/0177853 A1 | 7/2012 | Gruenwald | |
| 2012/0217643 A1 | 8/2012 | Pagaila | |
| 2013/0207248 A1 | 8/2013 | Bensoussan et al. | |
| 2014/0252584 A1 * | 9/2014 | Spory | H01L 24/83 |
| | | | 257/690 |
| 2016/0181168 A1 | 6/2016 | Spory | |
| 2016/0181171 A1 | 6/2016 | Spory | |
| 2016/0225686 A1 | 8/2016 | Spory | |
| 2016/0329305 A1 * | 11/2016 | Chiao | H01L 25/0657 |
| 2018/0040529 A1 | 2/2018 | Spory | |
| 2018/0047685 A1 | 2/2018 | Spory | |

(56) References Cited

U.S. PATENT DOCUMENTS

2018/0047700 A1 2/2018 Spory
2018/0053702 A1 2/2018 Spory
2018/0061724 A1 3/2018 Spory

OTHER PUBLICATIONS

Notice of Allowance for U.S. Appl. No. 14/142,823, dated Nov. 30, 2017.
Notice of Allowance for U.S. Appl. No. 14/142,823, dated Feb. 16, 2018.
Notice of Allowance for U.S. Appl. No. 15/088,822, dated Nov. 13, 2017.
Notice of Allowance for U.S. Appl. No. 15/088,822, dated Aug. 15, 2017.
Getters—molecular scavengers for packaging, Dr. Ken Gilleo and Steve Corbett, HDI Jan. 2001, www.hdi-online.com, 4 pages.
Cookson Group STAYDRY SD1000 High Temperature Moisture Getter data sheet, Cookson Group, May 30, 2011, 1 page.
Wikipdia "Getter", retrieved May 30, 2011, http://en.wikipedia.org/wiki/Getter.
Wikipdia "Kirkendall effect", retrieved Jul. 5, 2011, http://en.wikipedia.org/wiki/Kirkendall effect.
Flip Chips dot com, Tutorial 72—Mar. 2007, Redistribution Layers, article by George A. Riley, PhD, Flipchips dot com website, downloaded Dec. 18, 2011: http://www.flipchips.com/tutorial72.html.
MIT article "Liquid Metal Printer Lays Electronic Circuits on Paper, Plastic, and even Cotton", downloaded from MIT Technology Review Nov. 22, 2013, http://www.technologyreview.com/view/521871/liquid-metal-printer-lays-electronic-circuits-on-paper-plastic-and-even-cotton/.
sPRO 125 and sPRO 250 Direct Metal SLM Production Printer datasheet, 3DSystems, Part No. 70743, Issue Date Apr. 10, 2012.
Wikipedia "3D Printing" reference, downloaded Jan. 12, 2015.
Wikipedia "Screen printing" reference, downloaded Jan. 12, 2015.
Wikipedia "Ball Bonding", downloaded Apr. 11, 2016.
Solid State Technology "The back-end process: Step 7—Solder bumping step by step", by Deborah S. Patterson, http://electroiq.com/blog/2001/07/the-back-end-process-step-7-solder-bump- ing-step-by-step/, downloaded Apr. 11, 2016.
Official Action for U.S. Appl. No. 13/623,603, dated Dec. 9, 2014.
Official Action for U.S. Appl. No. 13/623,603, dated Apr. 16, 2015.
Official Action for U.S. Appl. No. 13/623,603, dated Aug. 14, 2015.
Official Action for U.S. Appl. No. 13/623,603, dated Apr. 29, 2016.
Official Action for U.S. Appl. No. 13/623,603, dated Aug. 24, 2016.
Official Action for U.S. Appl. No. 13/623,603, dated Apr. 11, 2017.
Official Action for U.S. Appl. No. 13/785,959, dated Jan. 5, 2015.
Official Action for U.S. Appl. No. 13/785,959, dated Apr. 16, 2015.
Official Action for U.S. Appl. No. 14/142,823, dated Jan. 5, 2015.
Official Action for U.S. Appl. No. 14/142,823, dated May 11, 2015.
Official Action for U.S. Appl. No. 14/142,823, dated Oct. 9, 2015.
Official Action for U.S. Appl. No. 14/142,823, dated Feb. 29, 2016.
Official Action for U.S. Appl. No. 14/142,823, dated Jul. 28, 2016.
Official Action for U.S. Appl. No. 14/142,823, dated Mar. 17, 2017.
Official Action for U.S. Appl. No. 14/565,626, dated Aug. 28, 2015.
Official Action for U.S. Appl. No. 14/600,691, dated Aug. 10, 2015.
Official Action for U.S. Appl. No. 14/600,691, dated Feb. 19, 2016.
Official Action for U.S. Appl. No. 14/600,691, dated Jul. 29, 2016.
Official Action for U.S. Appl. No. 14/600,691, dated Dec. 27, 2016.
Notice of Allowance for U.S. Appl. No. 14/600,691, dated Jun. 6, 2017.
Official Action for U.S. Appl. No. 14/600,733, dated Apr. 17, 2015.
Official Action for U.S. Appl. No. 14/600,733, dated Sep. 9, 2015.
Official Action for U.S. Appl. No. 14/600,733, dated May 9, 2016.
Official Action for U.S. Appl. No. 14/600,733, dated Aug. 23, 2016.
Official Action for U.S. Appl. No. 14/600,733, dated Dec. 2, 2016.
Notice of Allowance for U.S. Appl. No. 14/600,733, dated Oct. 5, 2017.
Official Action for U.S. Appl. No. 15/088,822, dated Mar. 24, 2017.
Official Action for U.S. Appl. No. 15/792,414, dated Mar. 19, 2018.
Notice of Allowance for U.S. Appl. No. 15/792,414, dated May 14, 2018.
Official Action for U.S. Appl. No. 15/792,312, dated Apr. 19, 2018.
Official Action for U.S. Appl. No. 15/792,381, dated Apr. 16, 2018.

* cited by examiner

*Fig. 1  Bare Die with Die Pads*
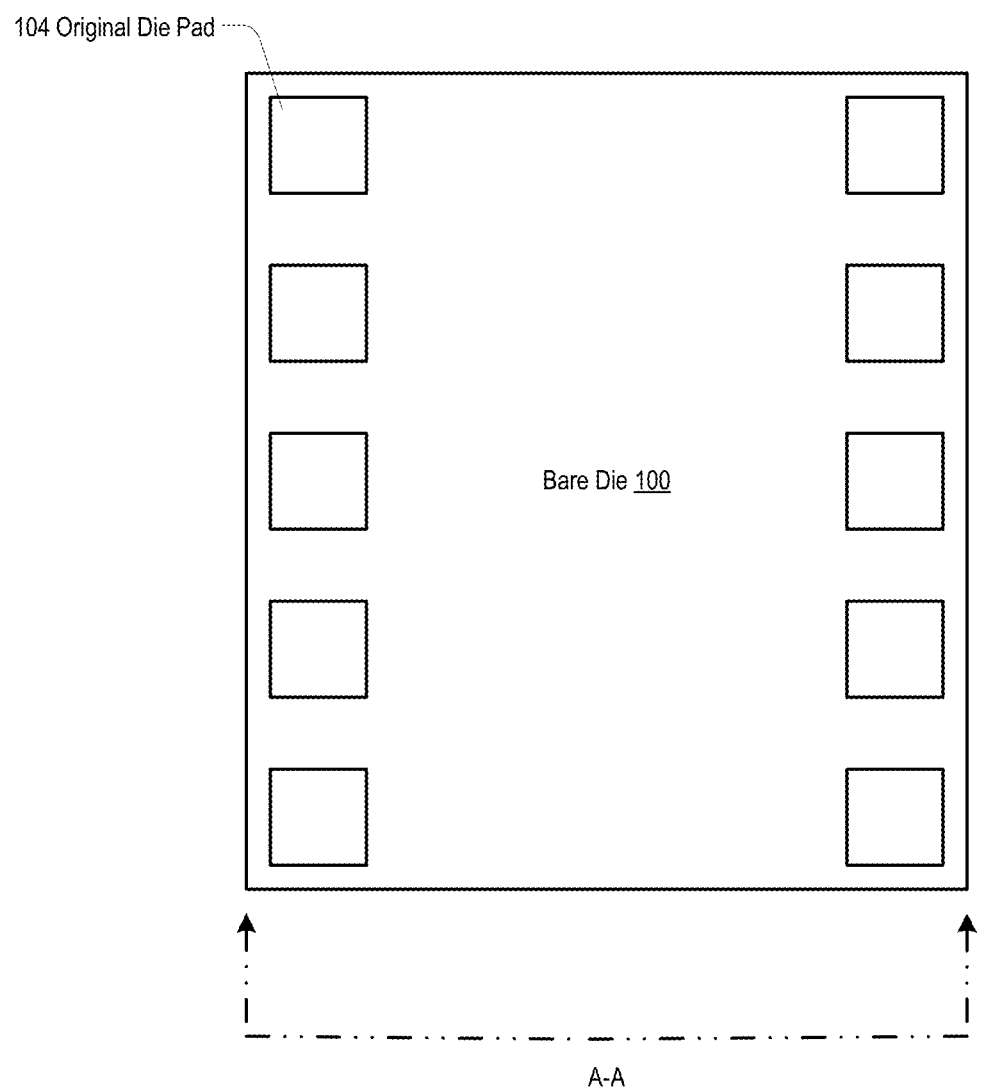

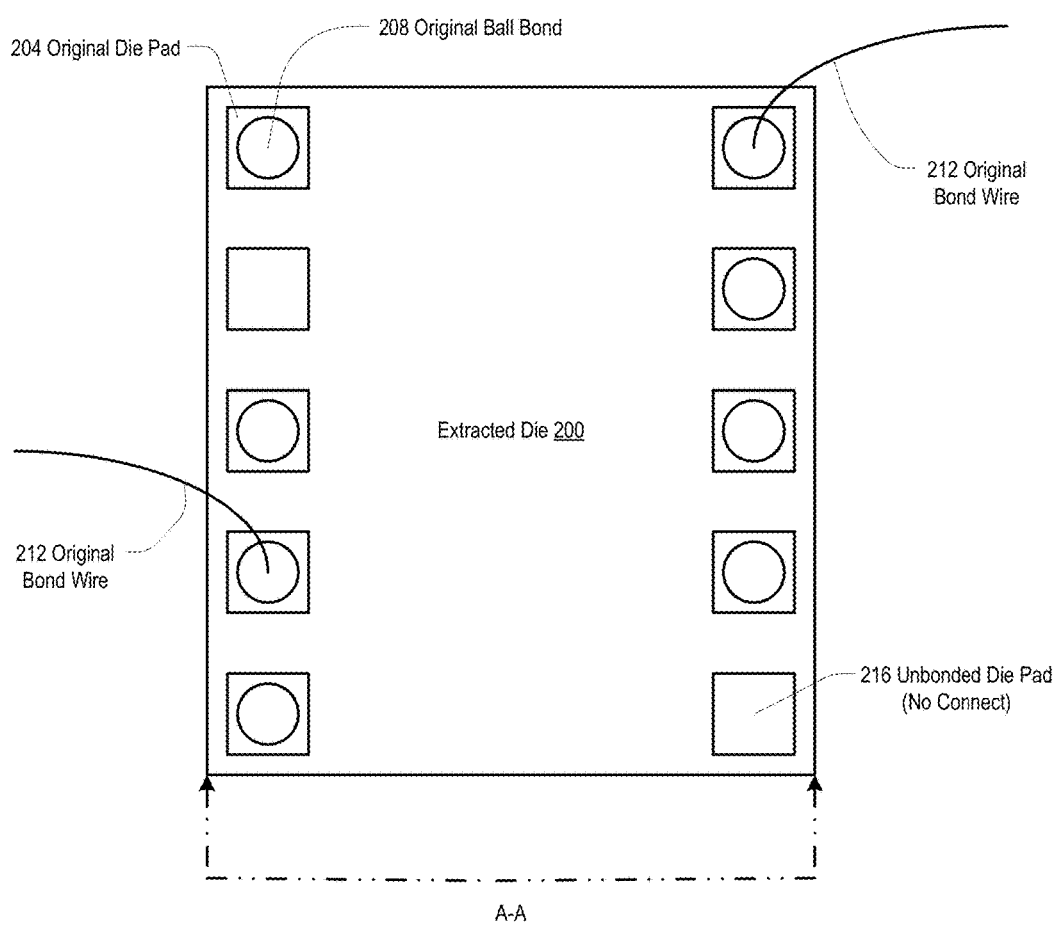
Fig. 2 Extracted Die with Bond Pads, Ball Bonds, and Bond Wires

Fig. 3A  Extracted Die Section A-A
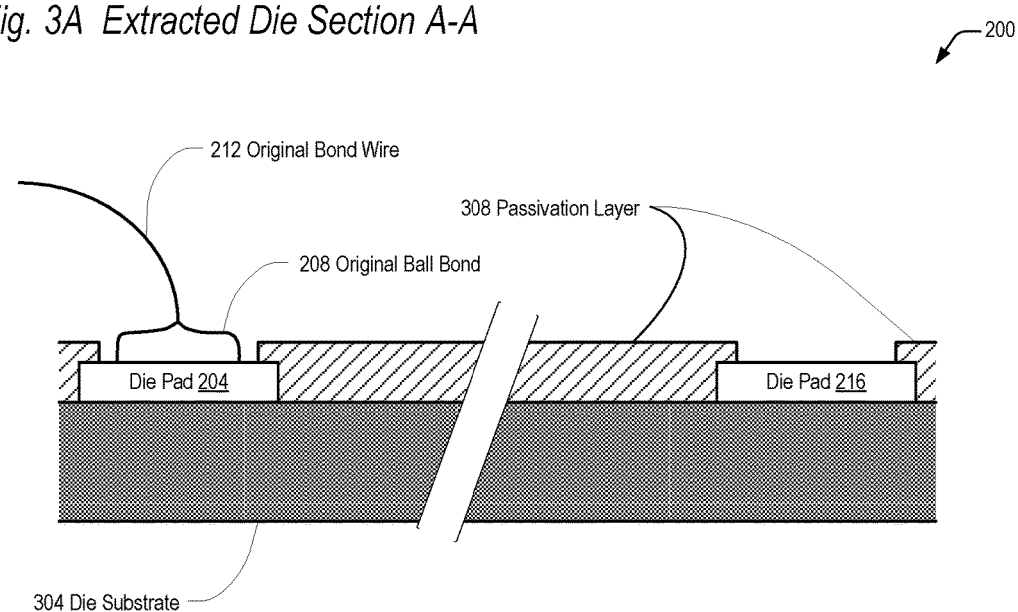
Fig. 3B  Modified Extracted Die Section A-A
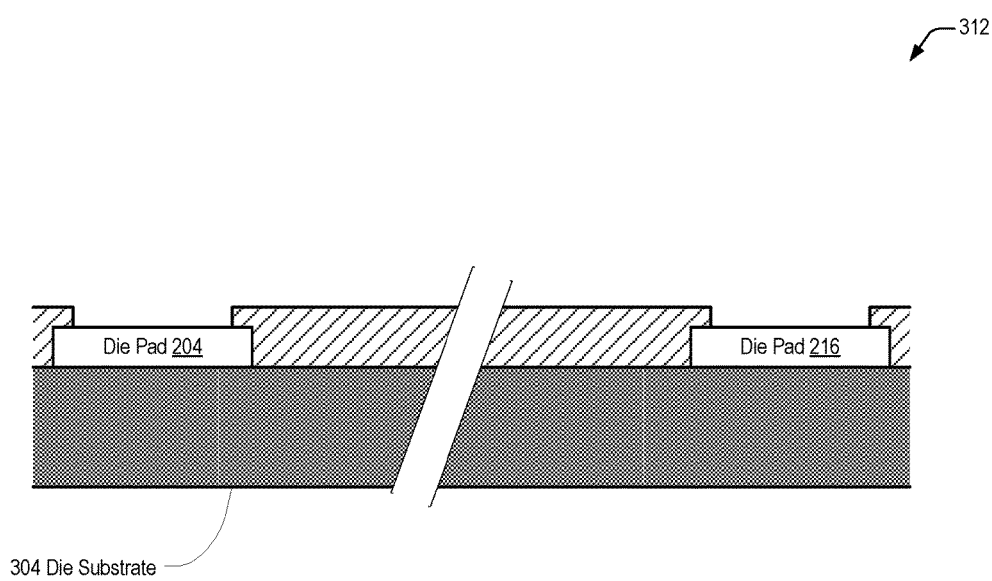

Fig. 3C  Electroless Nickel Layer Application Section A-A
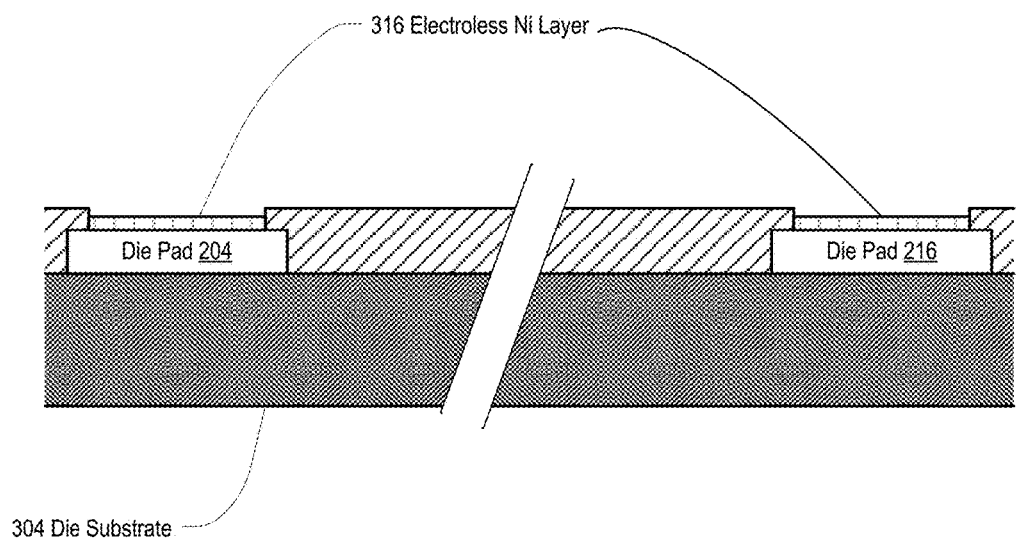
Fig. 3D  Electroless Palladium Layer Section A-A
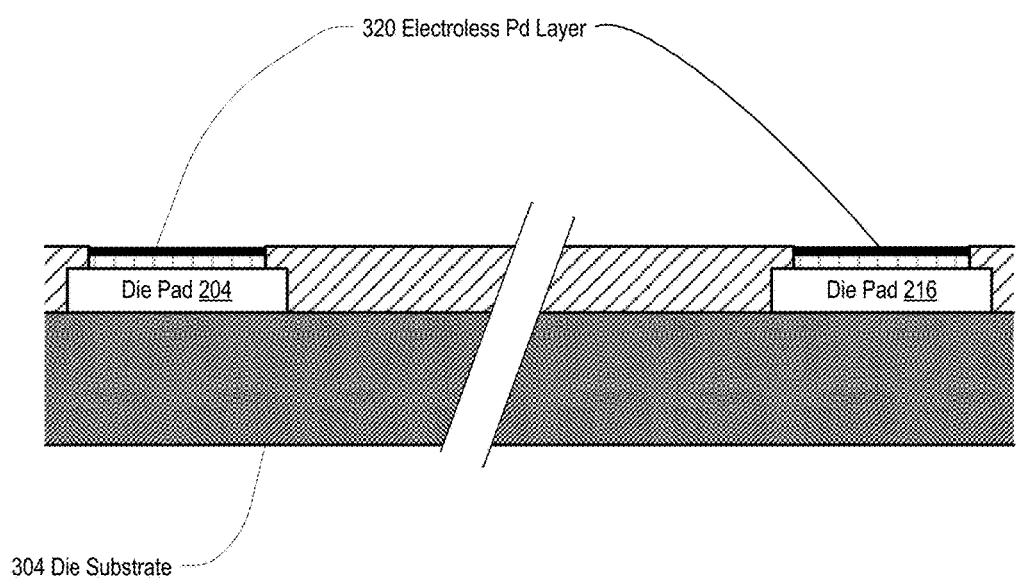

Fig. 3E  Immersion Gold Layer Application Section A-A
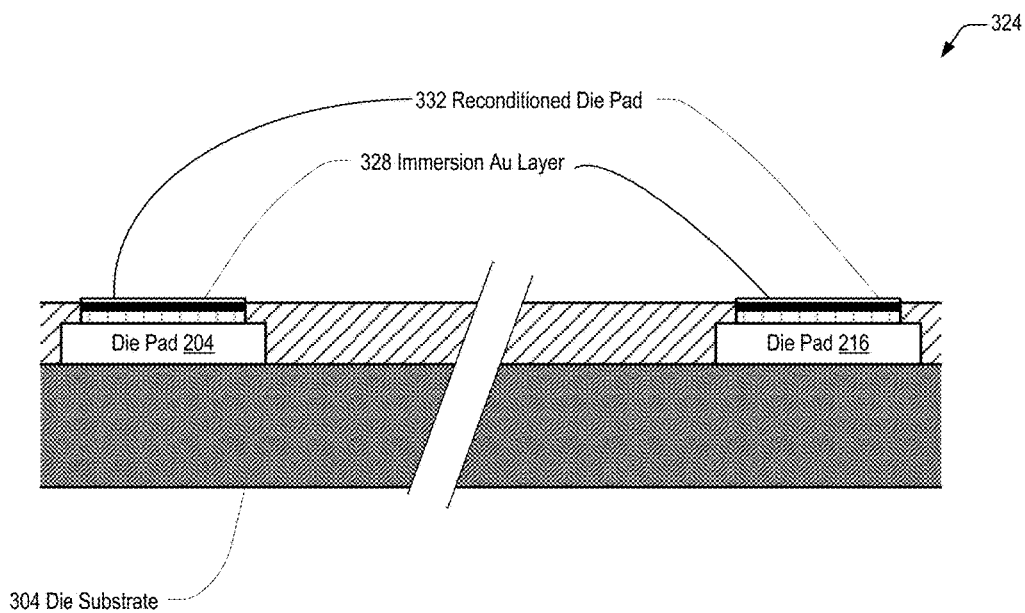
Fig. 3F  Extracted Die after 3D Printing Process Section A-A
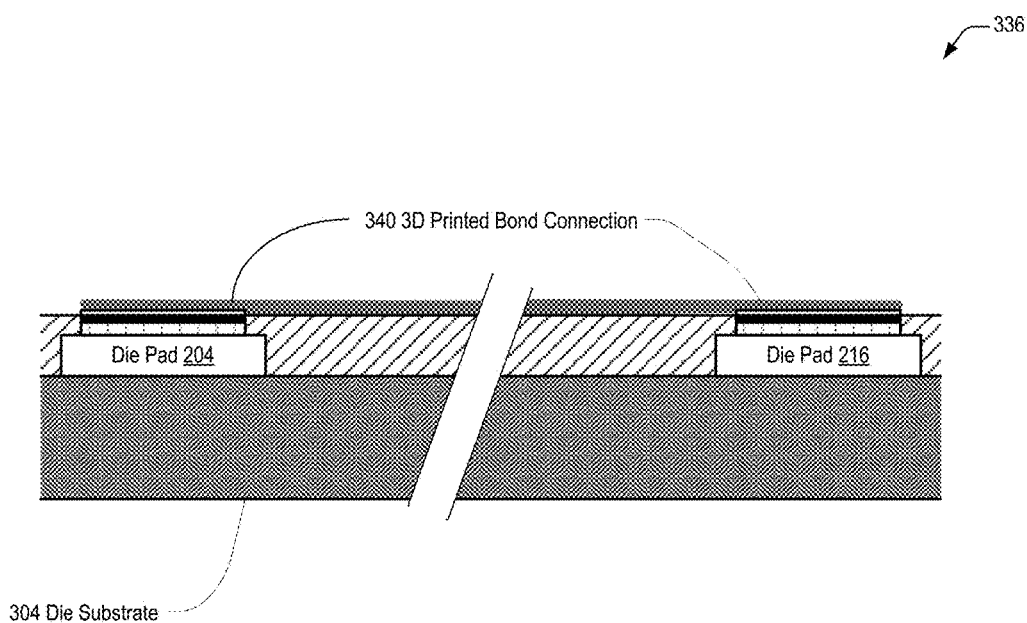

*Fig. 4A Bare Die and Extracted Die Section A-A*
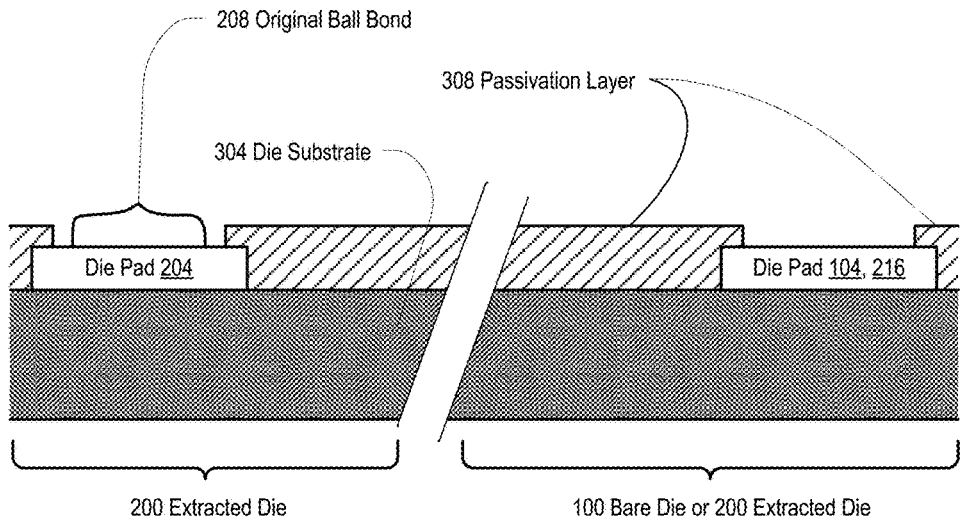
*Fig. 4B Bare Die and Extracted Die after 3D Printing Process*
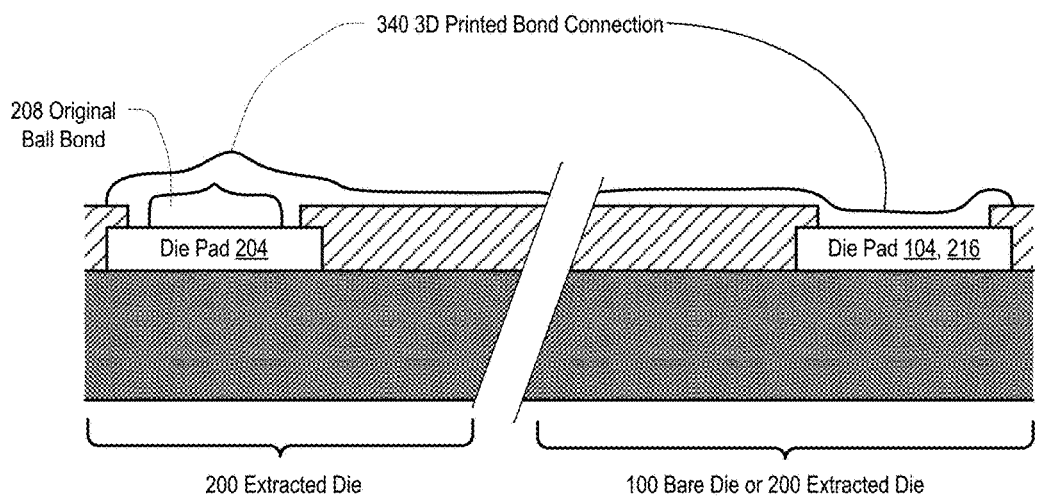

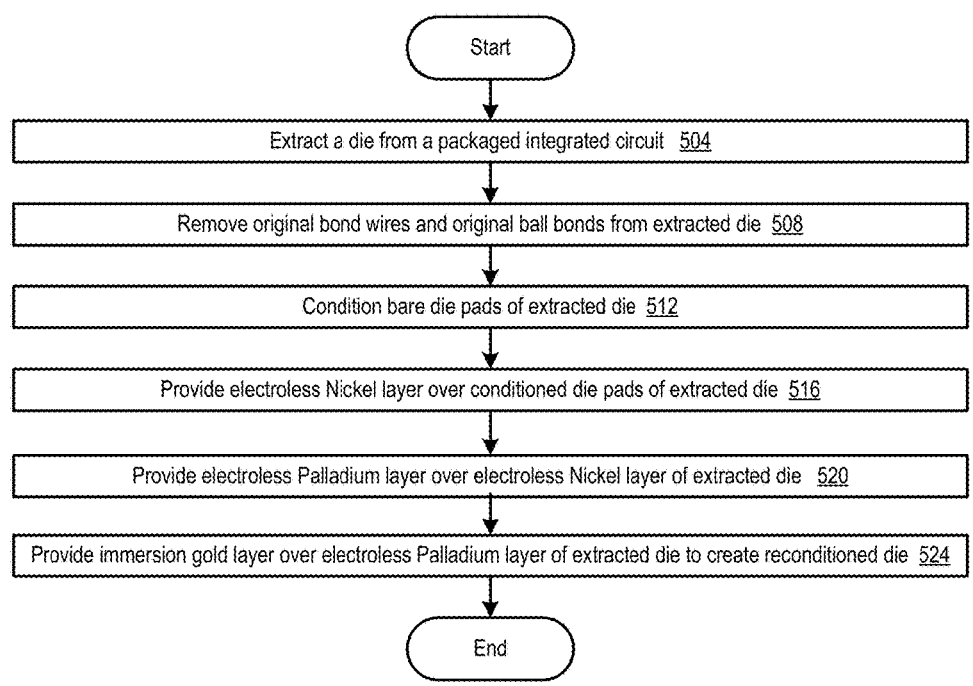
Fig. 5A Reconditioning Process for Extracted Die

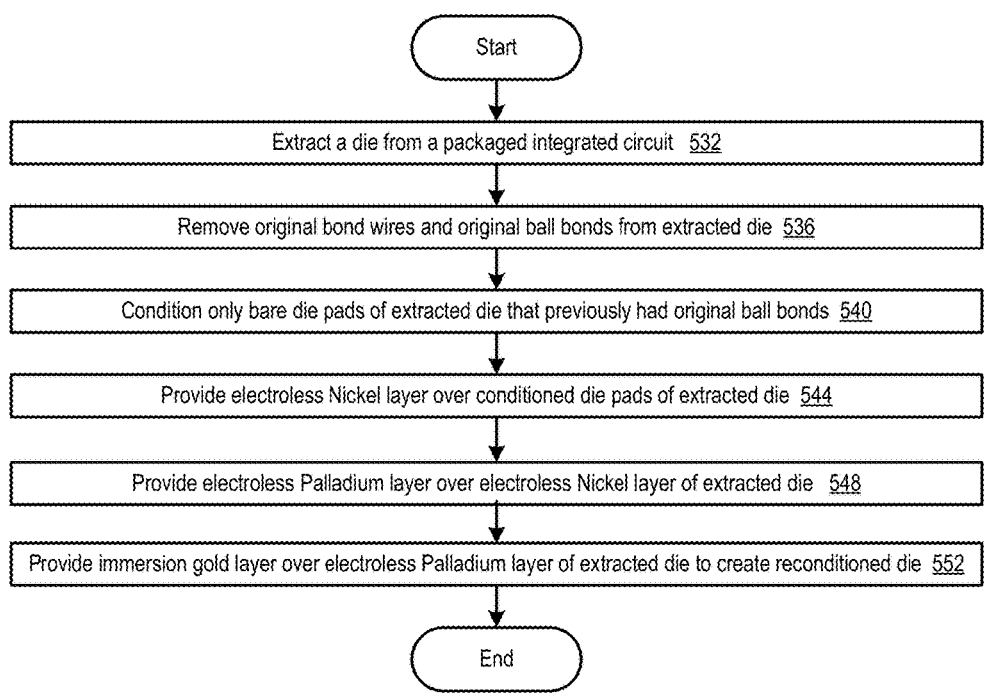
Fig. 5B Reconditioning Process for Extracted Die

*Fig. 6 3D Printing a Bond Connection*
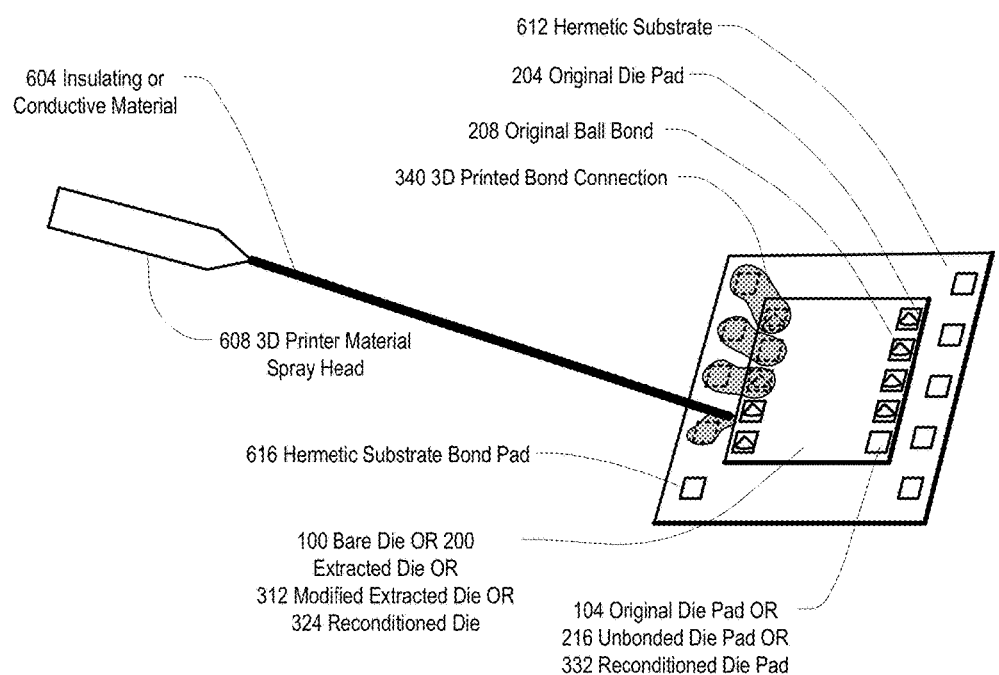

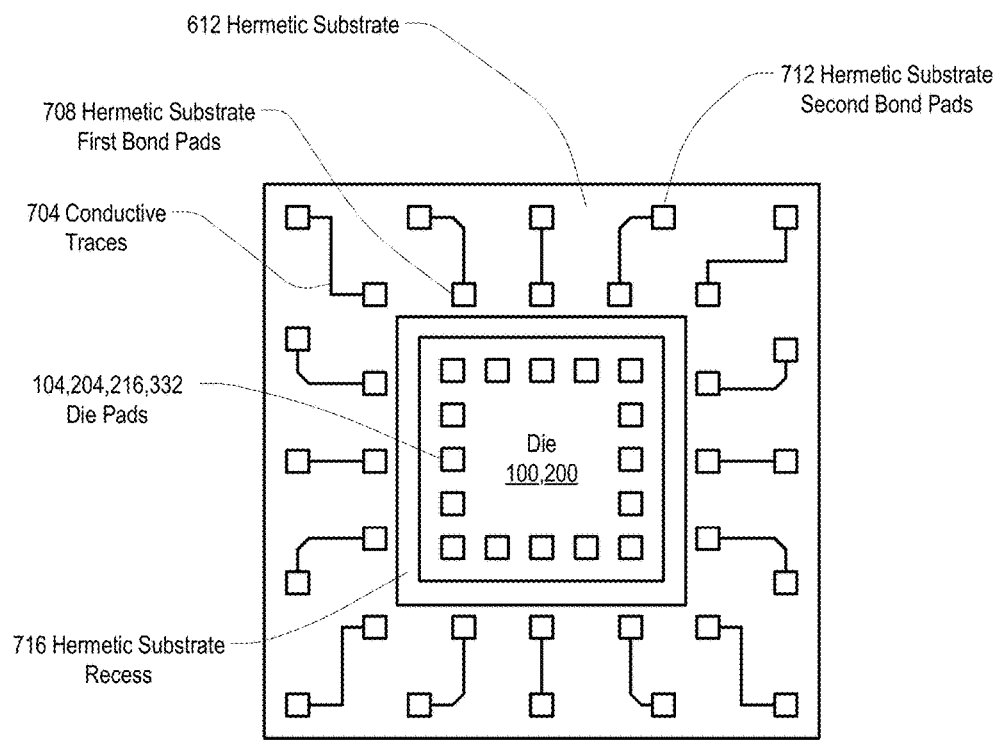
Fig. 7A Top View of Die Attached to Hermetic Substrate

*Fig. 7B Top View Hermetic Substrate Side Fill*
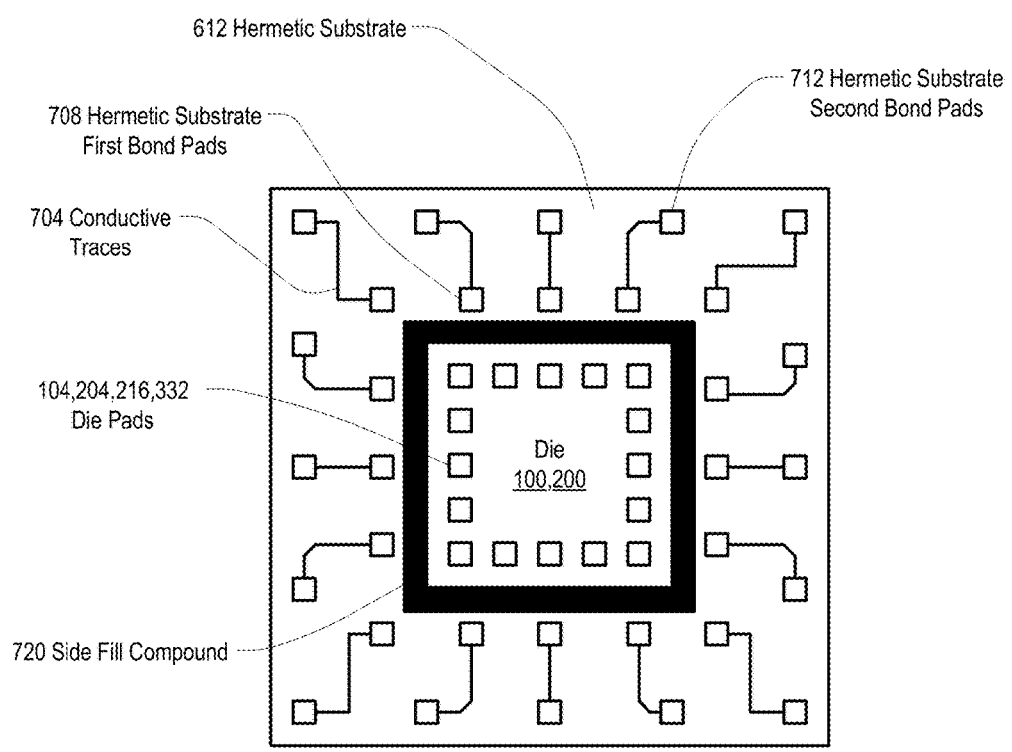

*Fig. 7C Top View Hermetic Substrate After 3D Printing Bond Insulators*
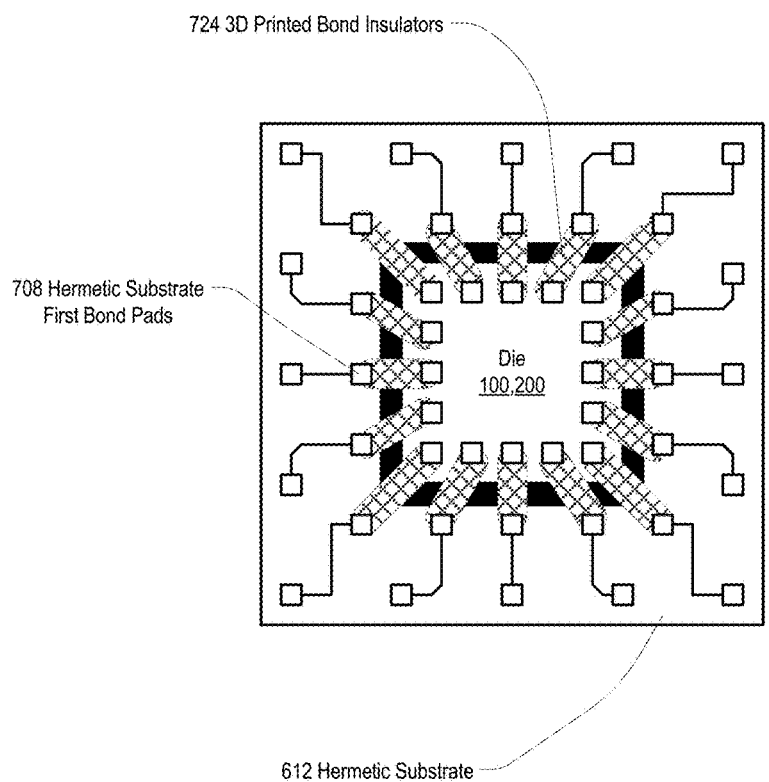

Fig. 7D  Hermetic Substrate After 3D Printing Bond Conductors
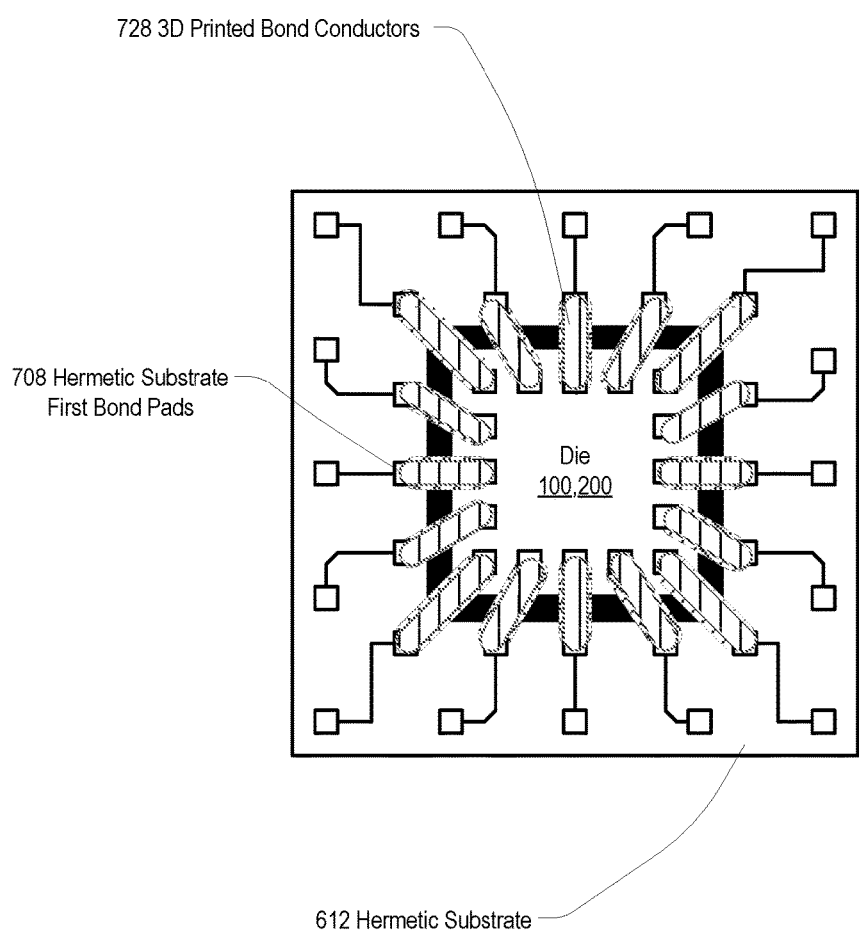

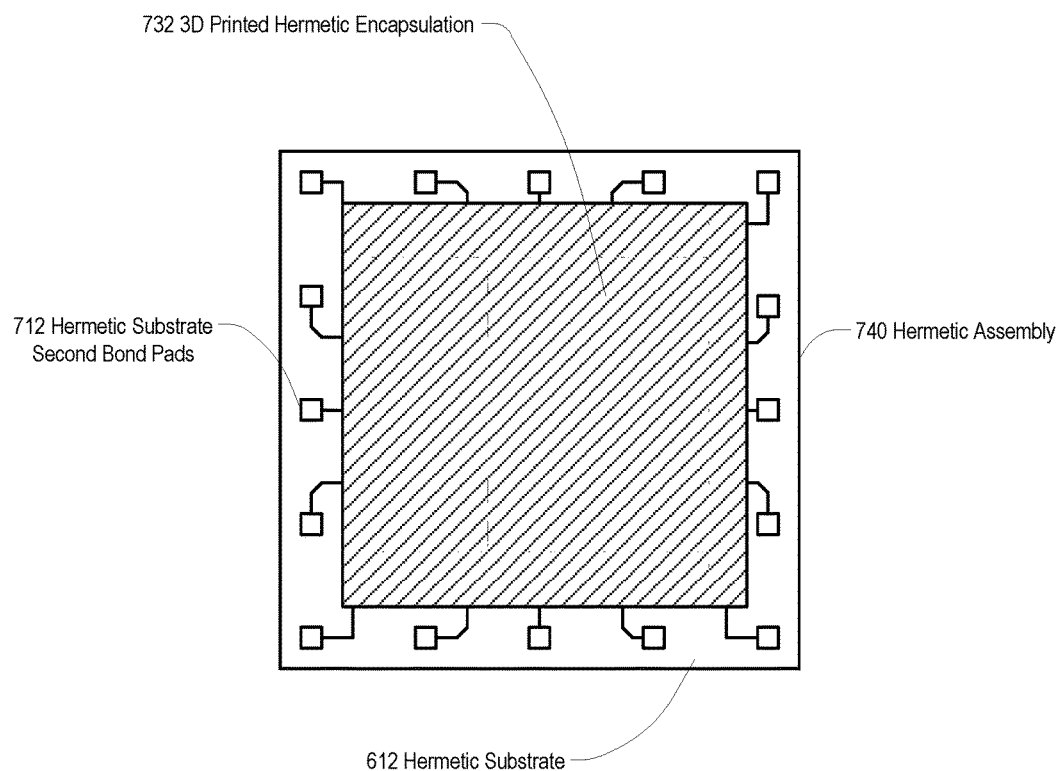
Fig. 7E Top View Hermetic Substrate After 3D Printing Encapsulation

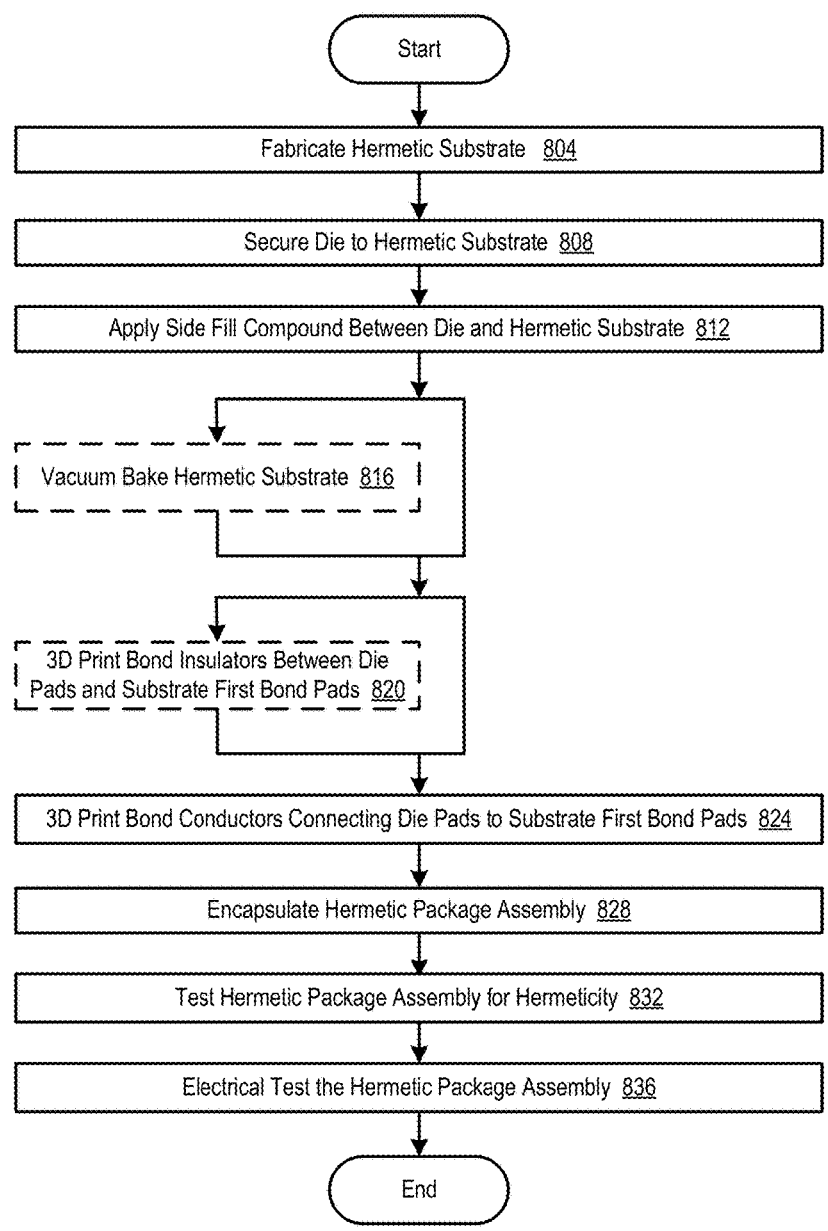
Fig. 8 Assembly Process for 3D Printed Hermetic Substrate

Fig. 9 Vacuum Bake Process
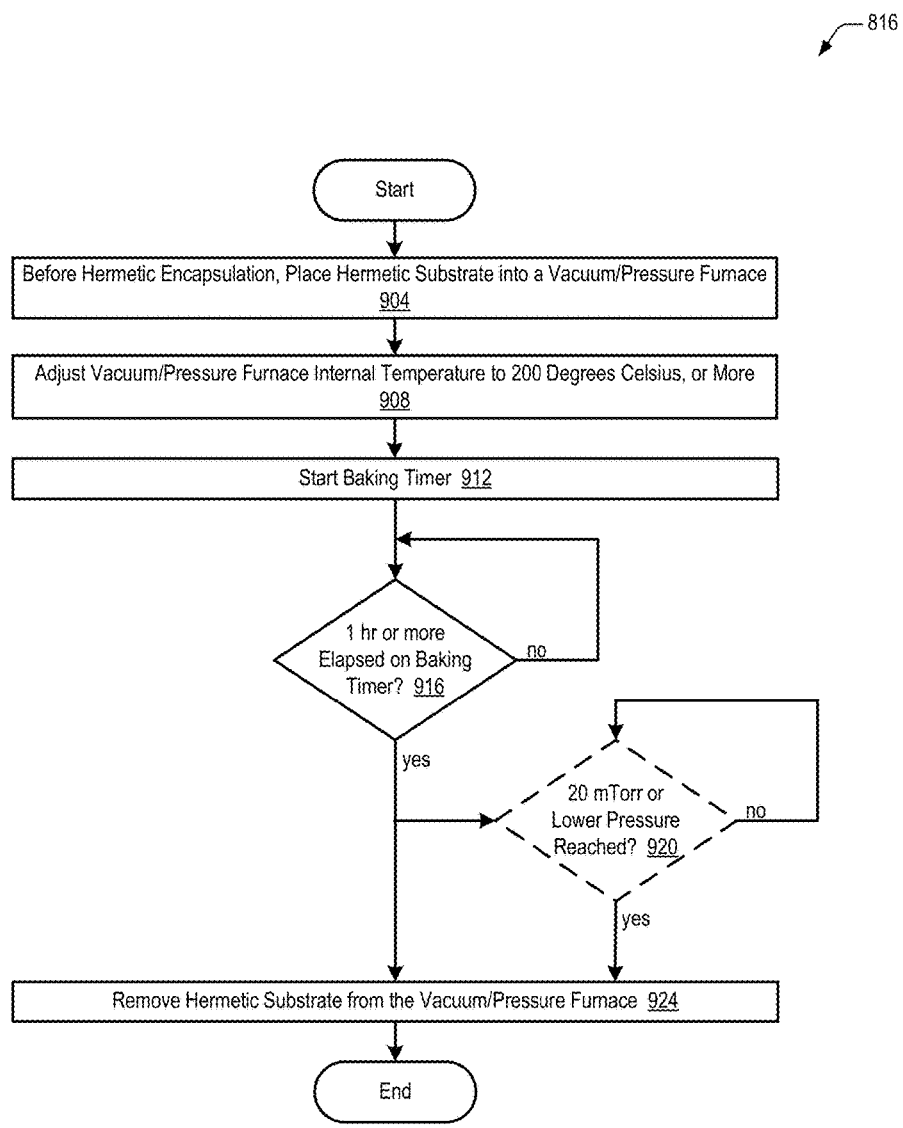

*Fig. 10A Hermetic Substrate for Mounting Die*
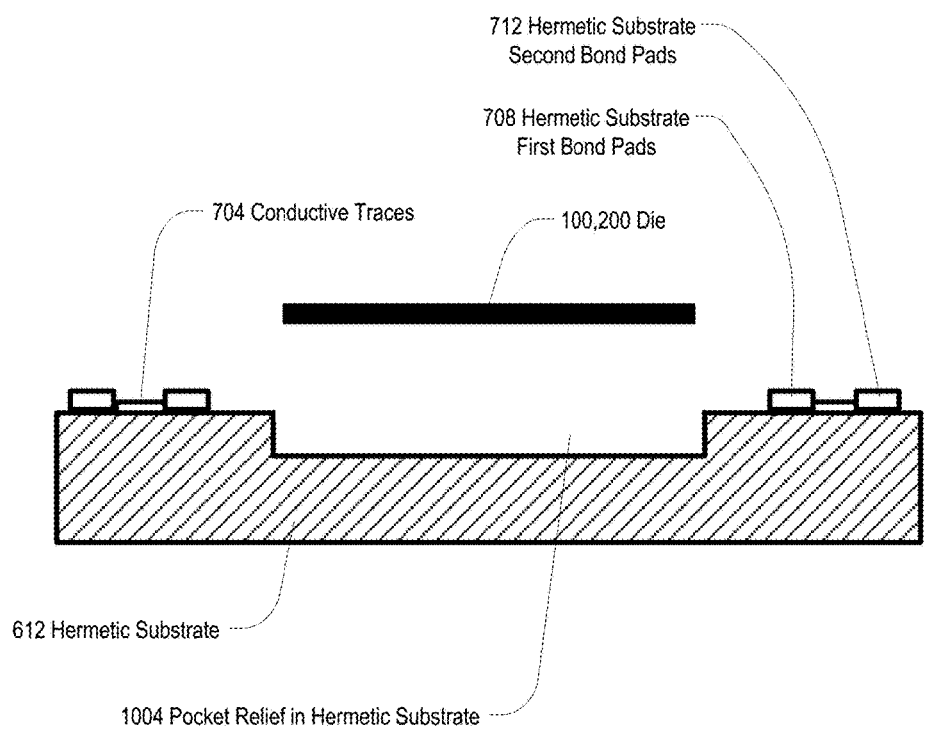

Fig. 10B Die Mounted to Hermetic Substrate
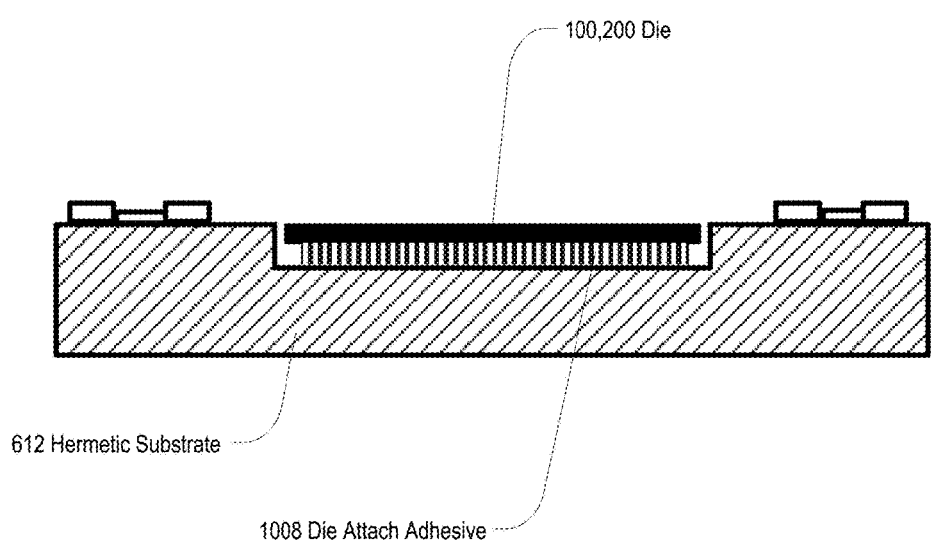

*Fig. 10C Side Fill Compound Applied to Hermetic Substrate*
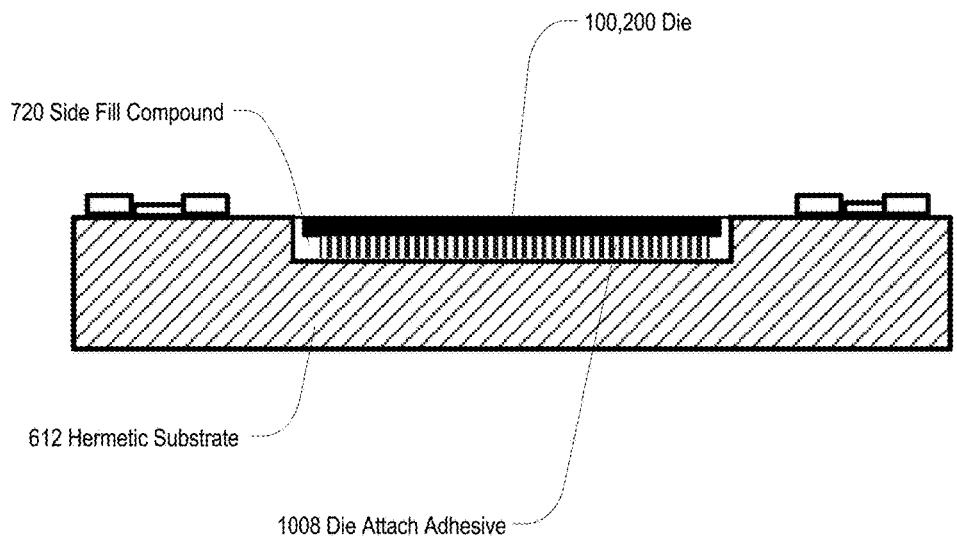

*Fig. 10D 3D Printed Bond Connections*
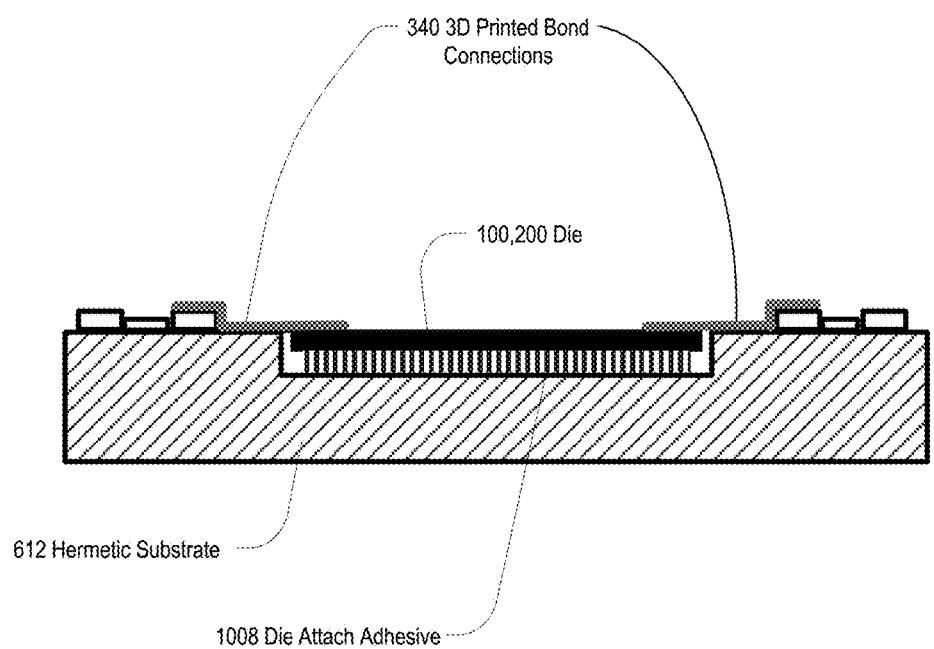

Fig. 10E Hermetic Encapsulation
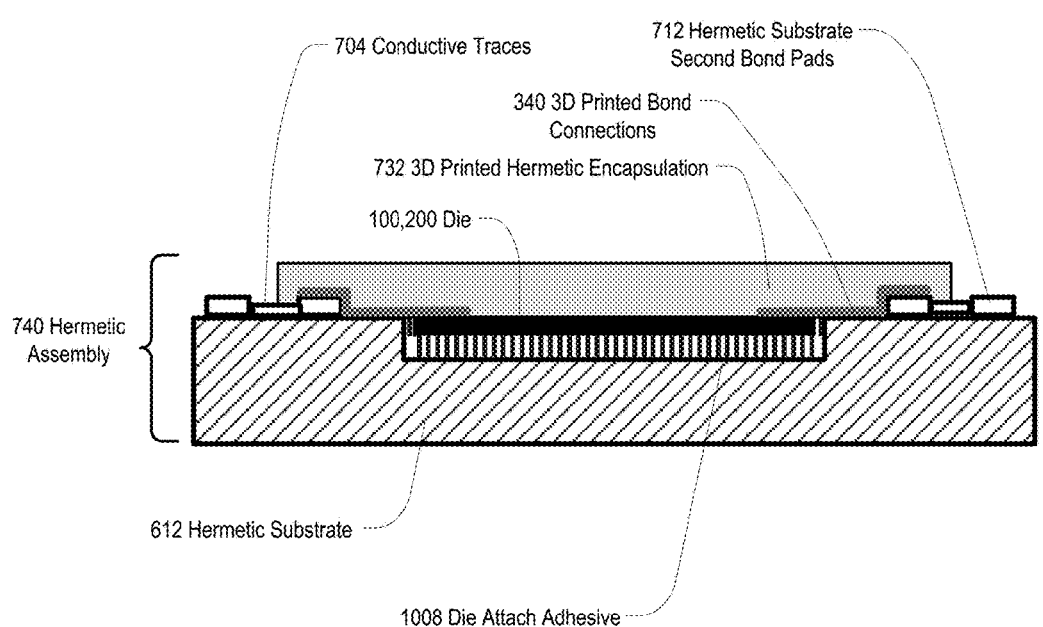

*Fig. 11A Hermetic Assembly Mounting*
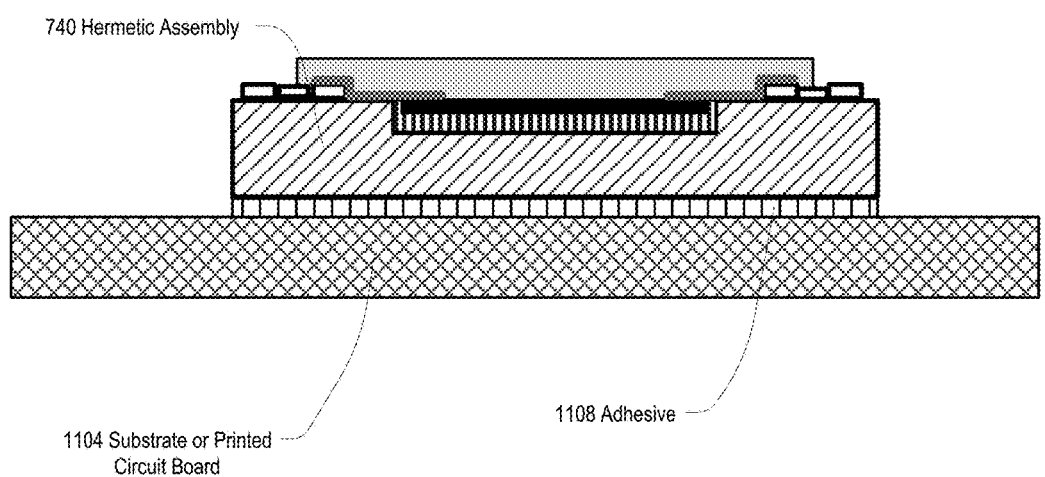

Fig. 11B Hermetic Device Mounting
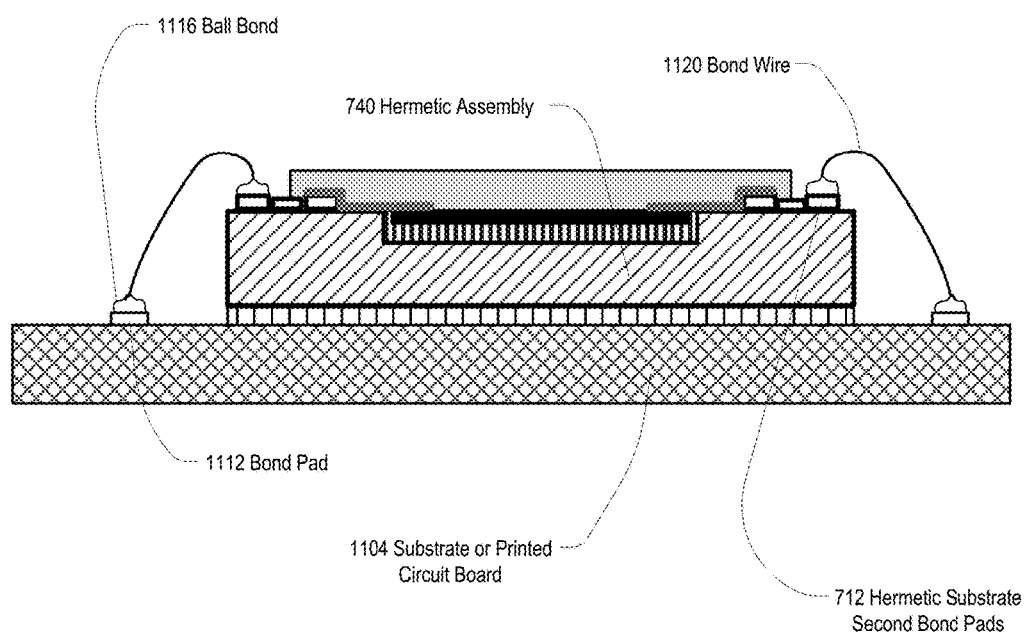

*Fig. 11C Hermetic Device Mounting*
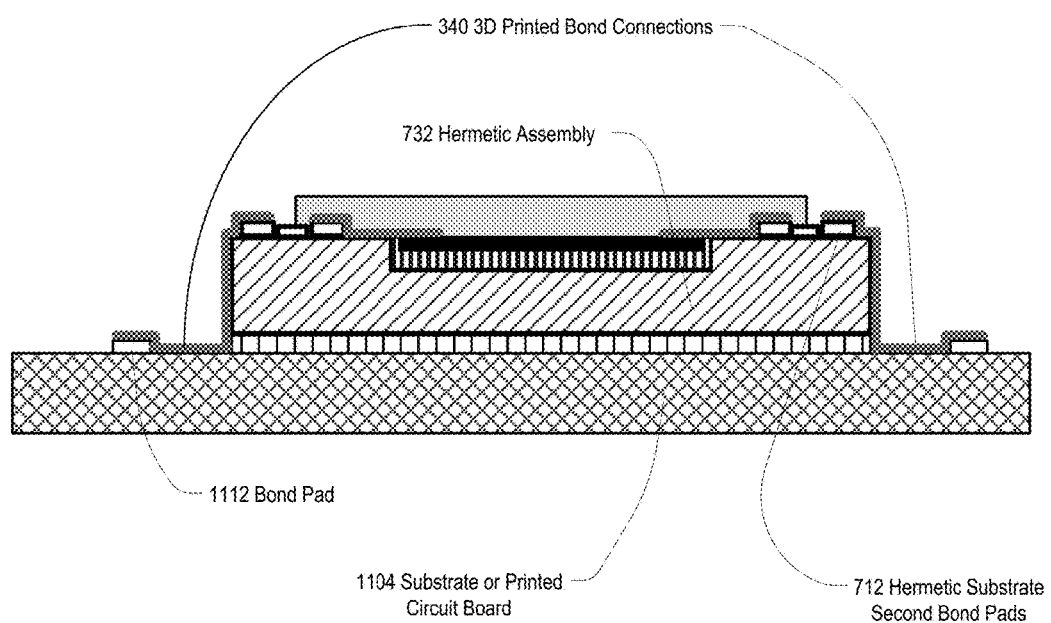

*Fig. 12 Assembly Process for Completed Assembly*
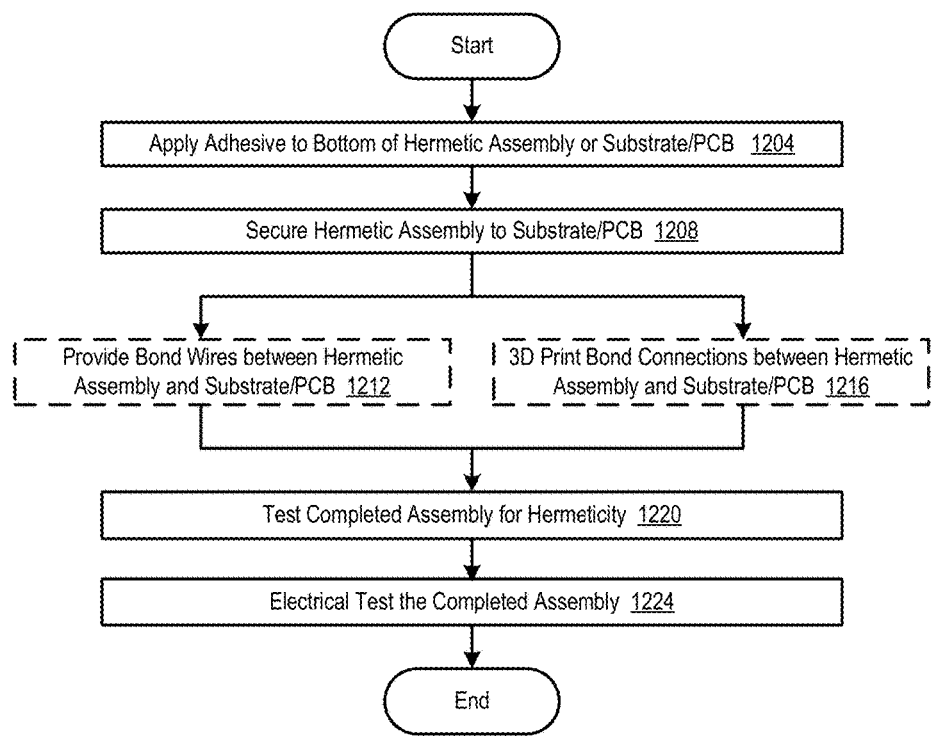

3D PRINTED HERMETIC PACKAGE
ASSEMBLY AND METHOD

CROSS REFERENCE TO RELATED
APPLICATION(S)

This application is a Continuation-in-Part of pending non-Provisional U.S. application Ser. No. 14/142,823 filed Dec. 28, 2013, entitled METHOD AND APPARATUS FOR PRINTING INTEGRATED CIRCUIT BOND CONNECTIONS, which is hereby incorporated by reference for all purposes, which is a Continuation-in-Part of pending non-Provisional U.S. application Ser. No. 13/785,959 filed Mar. 5, 2013, which is a Continuation-in-Part of pending non-Provisional U.S. application Ser. No. 13/623,603 filed Sep. 20, 2012, which is a Continuation of U.S. application Ser. No. 13/283,293 filed Oct. 27, 2011, now abandoned.

This application is also a Continuation-in-Part of pending non-Provisional U.S. application Ser. No. 14/600,733 filed Jan. 20, 2015, entitled INTEGRATED CIRCUIT WITH PRINTED BOND CONNECTIONS, which is hereby incorporated by reference for all purposes, which is a Divisional of pending non-Provisional U.S. application Ser. No. 14/142,823 filed Dec. 28, 2013, which is a Continuation-in-Part of pending non-Provisional U.S. application Ser. No. 13/785,959 filed Mar. 5, 2013, which is a Continuation-in-Part of pending non-Provisional U.S. application Ser. No. 13/623,603 filed Sep. 20, 2012, which is a Continuation of U.S. application Ser. No. 13/283,293 filed Oct. 27, 2011, now abandoned.

This application is also a Continuation-in-Part of pending non-Provisional U.S. application Ser. No. 15/088,822 filed Apr. 1, 2016, entitled REPACKAGED INTEGRATED CIRCUIT AND ASSEMBLY METHOD, which is hereby incorporated by reference for all purposes, which is a Continuation-in-Part of pending non-Provisional U.S. application Ser. No. 13/623,603 filed Sep. 20, 2012, which is a Continuation of U.S. application Ser. No. 13/283,293 filed Oct. 27, 2011, now abandoned.

FIELD

The present invention is directed to integrated circuit packaging. In particular, the present invention is directed to methods and apparatuses for creating hermetic integrated circuits capable of operating at extended temperatures over extended lifetimes.

BACKGROUND

Integrated circuits are available in many different packages, technologies, and sizes. Most integrated circuits are available in plastic packages, which are generally intended for commercial operating environments at a low cost. Commercial operating environments have a specified operating range from 0° C. to 70° C. Integrated circuits for military applications have historically been packaged in either metal or ceramic hermetic packages, which are able to work reliably in more demanding environments than commercial integrated circuits. Military operating environments have a specified operating range from −55° C. to 125° C. In order to save costs, the military has purchased integrated circuits through COTS (Commercial Off-The-Shelf) programs. However, these components are generally commercial grade components in plastic packages, and not intended for demanding environments requiring the broader temperature range reliability and durability of ceramic and metal hermetically packaged integrated circuits.

Depending on size and complexity, integrated circuits are available in a wide range of packages. Although many older integrated circuits were packaged using through-hole technology packages, surface mount packages have dominated over the past several decades. Surface mount packages generally have circuit density, cost, and other advantages over through-hole integrated circuits. Examples of through-hole packages include DIP (dual-in-line plastic) and PGA (pin grid array). Examples of surface mount packages include SOIC (small-outline integrated circuit) and PLCC (plastic leaded chip carrier).

In many cases, products requiring integrated circuits are in production or service for a longer time period than the manufacturing lifetime of a given integrated circuit. In such cases, it is not uncommon for parts to become obsolete or become unable to be purchased. For example, in a typical month, about 3% of all packaged integrated circuit product types become obsolete. One mitigating approach to this issue is to buy a sufficient lifetime inventory of spares for integrated circuits that are likely to become obsolete at a future date. However, this may be costly if a large quantity of integrated circuits needs to be purchased as spares. It also may result in far more spares being purchased that are actually required, since projected future needs may only be a rough estimate. When spares are needed in the future when an IC is no longer in active production, the ICs that are actually available may be in a different package than is required, since popular ICs are typically offered in multiple package options. For example, spares may be available in plastic DIP packages while the using assemblies require SOIC packages.

SUMMARY

The present invention is directed to solving disadvantages of the prior art. In accordance with embodiments of the present invention, a method is provided. The method includes one or more of removing existing ball bonds from an extracted die, the extracted die including a fully functional semiconductor die removed from a previous package, placing the extracted die into a recess of a hermetic substrate, the extracted die having a centered orientation in the recess, applying a side fill compound into the recess between the extracted die and the hermetic substrate, 3D printing, by a 3D printer, a plurality of bond connections between die pads of the extracted die and first bond pads of the hermetic substrate in order to create a 3D printed die substrate, and 3D printing a hermetic encapsulation over the extracted die, the side fill compound, and the 3D printed bond connections in order to create a hermetic assembly.

In accordance with another embodiment of the present invention, a method is provided. The method includes one or more of removing an extracted die from a previous integrated circuit package, the extracted die including a fully functional semiconductor die with one or more ball bonds on one or more die pads and no bond wires coupled to the one or more ball bonds, placing the extracted die into a recess of a hermetic substrate, the extracted die having a centered orientation in the recess, applying a side fill compound into the recess between the extracted die and the hermetic substrate, 3D printing, by a 3D printer, a plurality of bond connections between die pads of the extracted die and first bond pads of the hermetic substrate in order to create a 3D printed die substrate, and 3D printing a hermetic encapsulation over the extracted die, the side fill compound, and the 3D printed bond connections in order to create a hermetic assembly.

An advantage of the present invention is that it provides an improved packaged integrated circuit that works reliably at extended temperatures. Packaged integrated circuits of the conventional art require components and assembly steps that take longer and add cost relative to the present invention. Therefore, the former methods are less suitable for volume production.

Another advantage of the present invention is it provides a hermetic integrated circuit with potentially a far smaller height and width envelope than a conventionally packaged hermetic integrated circuit. The resultant hermetic integrated circuit may be integrated within larger assemblies utilizing printed circuit boards, substrates, or other structures.

Yet another advantage of the present invention is it provides improved reliability compared to conventional integrated circuits using bond wire and ball bond connections. The present invention utilizes 3D printed bond connections to provide reliable connections between die pads and bond pads of a hermetic substrate. 3D printed bond connections may optionally include 3D printed bond insulators to bridge conductive areas of an extracted die and/or hermetic substrate.

One additional advantage of the present invention is that it provides a 3D printed hermetic encapsulant over an extracted die, a side-fill compound, and areas of a hermetic substrate. 3D printers are able to apply material in successive layers to achieve a desired thickness, and with greater precision than many conventional processes may apply the material.

Additional features and advantages of embodiments of the present invention will become more readily apparent from the following description, particularly when taken together with the accompanying drawings.

BRIEF DESCRIPTION OF THE DRAWINGS

FIG. 1 is a diagram illustrating a bare die with die pads in accordance with embodiments of the present invention.

FIG. 2 is a diagram illustrating an extracted die with die pads, ball bonds, and bond wires in accordance with embodiments of the present invention.

FIG. 3A is a diagram illustrating a section A-A of an extracted die in accordance with embodiments of the present invention.

FIG. 3B is a diagram illustrating a section A-A of a modified extracted die after original ball bond and bond wire removal in accordance with embodiments of the present invention.

FIG. 3C is a diagram illustrating a section A-A of an electroless Nickel layer application in accordance with embodiments of the present invention.

FIG. 3D is a diagram illustrating a section A-A of an electroless Palladium layer application in accordance with embodiments of the present invention.

FIG. 3E is a diagram illustrating a section A-A of an immersion Gold layer application in accordance with embodiments of the present invention.

FIG. 3F is a diagram illustrating a section A-A of an extracted die after a 3D printing process in accordance with embodiments of the present invention.

FIG. 4A is a diagram illustrating a section A-A of a bare die and an extracted die in accordance with embodiments of the present invention.

FIG. 4B is a diagram illustrating a section A-A of a bare die and an extracted die after a 3D printing process in accordance with embodiments of the present invention.

FIG. 5A is a flowchart illustrating a reconditioning process for an extracted die in accordance with a first embodiment of the present invention.

FIG. 5B is a flowchart illustrating a reconditioning process for an extracted die in accordance with a second embodiment of the present invention.

FIG. 6 is a diagram illustrating 3D printing a bond connection in accordance with embodiments of the present invention.

FIG. 7A is a diagram illustrating a top view of a die attached to a hermetic substrate in accordance with embodiments of the present invention.

FIG. 7B is a diagram illustrating a top view of a hermetic substrate side fill in accordance with embodiments of the present invention.

FIG. 7C is a diagram illustrating a top view of a hermetic substrate after 3D printing bond insulators in accordance with embodiments of the present invention.

FIG. 7D is a diagram illustrating a top view of a hermetic substrate after 3D printing bond conductors in accordance with embodiments of the present invention.

FIG. 7E is a diagram illustrating a top view of a hermetic substrate after 3D printing hermetic substrate encapsulation in accordance with embodiments of the present invention.

FIG. 8 is a flowchart illustrating an assembly process for a 3D printed hermetic substrate in accordance with embodiments of the present invention.

FIG. 9 is a flowchart illustrating a vacuum bake process in accordance with embodiments of the present invention.

FIG. 10A is a diagram illustrating a side view of a hermetic substrate for mounting a die in accordance with embodiments of the present invention.

FIG. 10B is a diagram illustrating a side view of a die mounted to a hermetic substrate in accordance with embodiments of the present invention.

FIG. 10C is a diagram illustrating a side view of a side fill compound applied to a hermetic substrate in accordance with embodiments of the present invention.

FIG. 10D is a diagram illustrating a side view of 3D printed bond connections in accordance with embodiments of the present invention.

FIG. 10E is a diagram illustrating a side view of hermetic encapsulation in accordance with embodiments of the present invention.

FIG. 11A is a diagram illustrating a side view of a hermetic assembly mounting in accordance with embodiments of the present invention.

FIG. 11B is a diagram illustrating a side view of a hermetic device mounting in accordance with a first embodiment of the present invention.

FIG. 11C is a diagram illustrating a side view of a hermetic device mounting in accordance with a second embodiment of the present invention.

FIG. 12 is a flowchart illustrating an assembly process for a completed assembly in accordance with embodiments of the present invention.

DETAILED DESCRIPTION

Many operating environments require integrated circuit components capable of operating reliably at extended temperatures. Some of these environments include engine controls, down-hole drilling, and foundry manufacturing operations. Engine controls are often located in close proximity to an internal combustion, gas turbine, or jet engine, and are sometimes located on the engine side of a firewall. Downhole drilling requires a wide variety of sensors, control components, and communication components operating in close proximity to a drill. In addition to heat generated by the drill itself, drilling far below the Earth's crust can reach operating environment temperatures of greater than 200° C. due to geothermal heat. Foundry operations require sensors and control components operating in close proximity to molten metal.

Although military grade integrated circuits are often desirable for extended high temperature environments, in many cases the environments themselves experience higher temperatures than the military grade integrated circuit temperature rating. For example, down-hole drilling environments sometimes reach temperatures of 250° C., while military-grade integrated circuits commonly have a −55° C. to 125° C. operating temperature range. Another problem is the required integrated circuits may not be available in packages that can reliably withstand these temperature extremes. Required integrated circuits are sometimes out of production, and it is typically prohibitively expensive to procure new integrated circuits in suitable packaging.

In some environments, traditional ceramic or metal hermetic packaging may be unsuitable for target environments. For example, a target environment may be sufficiently compact and space-constrained that traditional hermetic packaged integrated circuits may not fit within a required envelope. Or, the target environment may experience very high or unpredictable levels of shock and vibration that may render traditional integrated circuits using ball bonds and wire bonds potentially unreliable. Therefore, what is needed is a method for modifying existing integrated circuits in order to occupy minimal space and still work reliably at extended temperature operating environments.

Referring now to FIG. 1, a diagram illustrating a bare die 100 with die pads 104 in accordance with embodiments of the present invention is shown. Bare die 100 is an individual semiconductor die or substrate, and is usually fabricated in suitable technologies including Silicon (Si) and Gallium Arsenide (GaAs). Bare die 100 may have a single die or multiple interconnected dice. Regardless whether bare die 100 includes a single die or multiple interconnected dice, die circuitry is connected to original die pads 104 of the bare die 100. Original die pads 104 are generally aluminum (Al) or copper (Cu) alloy pads. Section A-A provides a reference to an end-on view for other drawings to illustrate the construction and methods of the present invention.

Referring now to FIG. 2, a diagram illustrating an extracted die 200 with die pads, ball bonds, and bond wires in accordance with embodiments of the present invention is shown. In most embodiments, extracted die 200 is an individual semiconductor die or substrate, and is usually fabricated in suitable technologies including Silicon (Si) and Gallium Arsenide (GaAs). Extracted die 200 may have a single die or multiple interconnected dice. Regardless whether extracted die 200 includes a single die or multiple interconnected dice, die circuitry is connected to original die pads 204, 216 of the extracted die 200. Original die pads 204 and unbonded die pads 216 are generally aluminum (Al) or copper (Cu) alloy pads. Each previously used original die pad 204 of the extracted die 200 has an original ball bond 208 present (usually gold), and possibly an associated original bond wire 212. When the extracted die 200 was present in whatever previous package was used for the extracted die 200, original bond wires 212 connected each of the original gold ball bonds 208 to a lead or a downbond of the previous package. FIG. 2 illustrates an exemplary extracted die 200, after it has been removed from a previous package. Therefore, some original bond wires 212 have been removed and only original gold ball bonds 208 and two original bond wires 212 remain. Depending on the specific extracted die 200, one or more unbonded die pads 216 may be present—where no original ball bond 208 and original bond wire 212 previously existed. Unbonded die pads 216 generally indicate a no connect to the previous package leads, and may or may not be connected to other circuitry of the extracted die 200. Section A-A provides a reference to an end-on view for other drawings to illustrate the construction and methods of the present invention.

Referring now to FIG. 3A, a diagram illustrating a section A-A of an extracted die 200 in accordance with embodiments of the present invention is shown. FIGS. 3A-3F illustrate a preferred reconditioning process to be applied to at least original die pads 204, and possibly unbonded die pads 216, for an extracted die 200 prior to assembling into a new hermetic assembly.

Extracted die 200 includes a die substrate 304 including various metallization layers known in the art. On the surface of the die substrate 304 are one or more Aluminum (Al) die pads 204, 216. A passivation layer 308 is applied over the die substrate 304 in order to protect the circuits of the die substrate 304, and the passivation layer 308 is relieved at each of the original die pads 204, 216 in order to provide bonding access.

Where original ball bonds 208 and original bond wires 212 are applied to original die pads, the die pads are die pads 204. Where no original ball bonds 208 and original bond wires 212 are applied to original die pads, the die pads are die pads 216. FIG. 3A illustrates the point at which the extracted die 200 has been removed from its' original package and one or more original ball bonds 208 and original bond wires 212 are present.

Referring now to FIG. 3B, a diagram illustrating a section A-A of a modified extracted die 312 after original ball bond and bond wire removal in accordance with embodiments of the present invention is shown. A modified extracted die 312 is an extracted die 200 with the original ball bonds 208 and original bond wires 212 removed. Although in some embodiments original gold ball bonds 208 may be removed by mechanical means, in most cases it is preferable to use chemical removal means by known processes. FIG. 3B illustrates the original ball bond 208 and original bond wire 212 removed from the original die pad 204. Not shown in FIG. 3B is that after removing the original ball bond 208 and original bond wire 212, some amount of intermetallic residue may be present on the original die pads 204. This generally requires removal to make sure there are no impurities or residue on the original die pads 204. The residue removal is referred herein as conditioning the die pads 204. Removal is preferably performed using a mild acid wash. The acid wash is followed by an acid rinse that removes surface oxides present on the original die pads 204. For plating on an Aluminum surface, a Zincate process is used to etch away a very fine layer of Aluminum from the die pads 204 and redeposit a layer of Zinc (Zn) on the die pads 204. The fine layer of Zinc will then act as a catalyst for the Nickel plating to follow.

Once in a clean and flat state, the original die pads 204 are considered conditioned die pads and are ready to be reconditioned. Reconditioning of the present invention is a process whereby the original die pads 204, and possibly unbonded die pads 216, are built up by successive and ordered application of specific metallic layers prior to 3D printing bond connection processes described herein.

In one embodiment, after an extracted die 200 is removed from a packaged integrated circuit, only original bond wires 212 are removed—thus leaving original ball bonds 208 on less than all original die pads 204 of the extracted die 200. Original ball bonds 208 must be removed prior to reconditioning original die pads 204. Therefore, in some embodiments the metallic layers of the present invention are provided not to unbonded die pads 216, but rather original die pads 204 following original ball bond 208 removal.

Referring now to FIG. 3C, a diagram illustrating a section A-A of an electroless Nickel layer application in accordance with embodiments of the present invention is shown. Electroless plating is more cost effective than electroplating since it does not require expensive photolithography and etch processes. However, electroless processes generally require thicker metal layers for good bondability.

A Nickel (Ni) layer 316 applied over a conditioned conventional Aluminum (Al) bond pad 204, 216 have been found to protect pad surfaces. Nickel possesses a much higher elastic modulus than either Copper (Cu) or Aluminum (Al), which leads Nickel to have high stiffness and fracture toughness and resist deflection and absorb energy during bonding processes. Thus, Nickel is a preferred metallic layer 316 for the initial layer application following original die pad 204, 216 conditioning.

An electroless Nickel plating bath is very complex and contains more chemicals (i.e. reducing agents, complexant or chelating agents, stabilizers, etc) than the Nickel source alone. These bath components perform specific functions during the chemical reaction. They are important in order to obtain a good quality Nickel deposit and must be monitored carefully during processing.

The plating rate of Nickel is a controllable parameter during the plating process, which in turn affects the final surface roughness. A fast plating rate will obviously increase the process throughput, but fast plating rates can also result in a rougher Nickel finish. Therefore, a careful balance must be maintained between processing speed and surface quality. If the Nickel surface is too rough, the next successive metal layers to be plated over the Nickel will follow the contours and also result in a rougher surface. Both surface hardness and roughness have a strong effect on wire bondability and bond strength. Harder and rougher surfaces are typically less bondable. For wire bonding applications, the electroless Nickel layer 316 is generally 120-240 microinches thick. However, since the processes of the present invention apply 3D printed bond connections 340 to the reconditioned die pads 332, a rougher Nickel layer 316 may be preferable to aid in adhesion since conventional wire bonds are not utilized. Thus, a faster Nickel plating 316 process may not only be preferable for application of subsequent layers including 3D printed bond connections 340, it also increases production throughput for reconditioned die pads 332.

Referring now to FIG. 3D, a diagram illustrating a section A-A of an electroless Palladium layer 320 application in accordance with embodiments of the present invention is shown. Electroless Palladium (Pd) 320 is applied over the electroless Nickel (Ni) 316 layer of FIG. 3C in order to inhibit Nickel diffusion into the immersion gold layer 328 applied afterward.

Palladium plating 320 was first investigated as a replacement for purely gold plating in order to alleviate the high cost of gold plating. Palladium and Palladium-Nickel alloys were initially developed for contact wear resistance in connector applications, but other technical advantages were identified as usage grew. Not only is a pure Palladium layer 320 very hard, but it is also very dense which assists as a diffusion barrier. As with the electroless Nickel layer 316, the electroless Palladium layer 320 requires a catalyst pre-treatment to prepare the surface for deposition. The metal source is typically a Palladium-Ammonia compound with a hydrazine reducing agent for metal deposition. For wire bonding applications, the electroless Palladium layer 320 is generally 2-4 microinches thick, approximately 2 orders of magnitude thinner than the electroless Nickel layer 316. Similar thicknesses may be used for 3D printed bond connections 340.

Referring now to FIG. 3E, a diagram illustrating a section A-A of an immersion Gold layer 328 application in accordance with embodiments of the present invention is shown. The immersion Gold layer 328 is applied over the electroless Palladium layer 320, and provides the top layer of the reconditioned die pads 332. Gold has long been a mature plating process for semiconductor applications. Two types of Gold plating processes through chemical reactions are used today: immersion and autocatalytic. Immersion Gold plating 328 is a self-limiting galvanic displacement process, where no reducing agent is required. For wire bonding applications, the electroless Gold layer 328 is generally at least 1-2 microinches thick, and preferably thicker. Similar thicknesses of 1-2 microinches thick may be used for 3D printed bond connections 340. Following the process step of FIG. 3E, the die is a reconditioned die 324. A bare die 100 does not require the processing of FIGS. 3A-3F due to the absence of ball bonds 208, oxides, and other residues or metallic impurities present on original die pads 104.

Because the ENEPIG plating process uses gold as the bonding layer with gold bond wire or 3D printed bond connections 340, there is no Aluminum (Al)-Gold (Au) interface that can degrade and corrode. Thus, the ENEPIG plating process produces more reliable bonding interfaces and is preferred for high temperature and hermetic applications over previous processes that maintained Al—Au interfaces and utilize moisture getter, noble gas insertion, and vacuum bakes to purge moisture from integrated circuit packages.

Referring now to FIG. 3F, a diagram illustrating a section A-A of an extracted die after a 3D printing process in accordance with embodiments of the present invention is shown. The combination of the electroless Nickel layer 316, electroless Palladium layer 320, and the immersion Gold layer 328 produces reconditioned die pads 332. Once die pads 204, 216 have been reconditioned, a 3D printer applies 3D printed bond connections 340 as described herein. 3D printed bond connections include at least 3D printed bond conductors 728 as shown in FIG. 7D, and may in some embodiments also include 3D printed bond insulators 724 as shown in FIG. 7C.

Referring now to FIG. 4A, a diagram illustrating a section A-A of a bare die 100 and an extracted die 200 in accordance with embodiments of the present invention is shown. FIGS. 4A and 4B illustrate an embodiment where 3D printed bond connections 340 are applied directly to die pads 104, 204, 216. The left portion of FIG. 4A corresponds to extracted die 200, where die pad 204 includes an original ball bond 208. Therefore, an original bond wire 212 corresponding to original ball bond 208 has already been removed, but the original ball bond 208 remains. The intention is therefore to not remove original ball bonds 208, but rather to 3D print bond connections 340 directly over original ball bonds 208 and die pads 204. This process assumes a satisfactory connection between original ball bonds 208 and original die pads 204, without the presence of significant oxides or residues that may hinder a strong electrical connection between a 3D printed bond connection 340 and original die pad 204 and original ball bond 208. If significant oxides or residues are present on original die pads 204, it is preferable to instead utilize the process of FIGS. 3A-3F. The process illustrated in FIGS. 4A and 4B is in contrast to the process illustrated in FIGS. 3A-3F, where all original bond wires 212 and original ball bonds 208 are removed from original die pads 204 prior to conditioning and reconditioning each of the die pads 204.

The right portion of FIG. 4A corresponds to either bare die 100 or extracted die 200, where no original ball bonds 208 are present on die pads 104 or 216. In this case, no surface conditioning or reconditioning processes are applied to die pads 104, 216. Because no previous original ball bonds 208 have been removed from die pads 104, 216, there are no oxides or metallic residues present on die pads 104, 216.

Referring now to FIG. 4B, a diagram illustrating a section A-A of a bare die 100 and an extracted die 200 after a 3D printing process in accordance with embodiments of the present invention is shown. FIG. 4B illustrates die pads 104, 204, 216 of FIG. 4A after application of 3D printed bond connections 340. 3D printed bond connections 340 in all embodiments include a 3D printed conductive layer 728. In some embodiments, 3D printed bond connections 340 may also include a 3D printed insulating layer 724 below the 3D printed conductive layer 728, in order to electrically isolate the 3D printed bond connection 340 from conductive surfaces of the bare die 100 or extracted die 200. By avoiding conditioning and reconditioning die pad steps shown in FIGS. 3A-3B, the embodiment illustrated in FIGS. 4A and 4B is much faster to apply, advantageously resulting in a higher throughput for creating hermetic assemblies 740.

Referring now to FIG. 5A, a flowchart illustrating a reconditioning process for an extracted die 200 in accordance with a first embodiment of the present invention is shown. This process converts an extracted die 200 (with original bond wires 212 and original ball bonds 208 removed) into a reconditioned die 324 of the present invention. Flow begins at block 504.

At block 504 a die 200 is extracted from a previous packaged integrated circuit. The previous package may be a hermetic or a non-hermetic package, and in either case is discarded and not reused. The extracted die 200 is a fully functional semiconductor die that will be utilized in a new hermetic assembly 740. Flow proceeds to block 508.

At block 508, original ball bonds 208 and original bond wires 212 attached to the original ball bonds 208 are removed from the extracted die 200 by conventional processes. Following removal of the original ball bonds 208 and associated original bond wires 212, some metallic or chemical residues is generally on the surface of each original die pad 204. Flow proceeds to block 512.

At block 512, original die pads 204, 216 are conditioned. Any metallic and/or chemical residues are removed from each of the original die pads 204, 216 in order to prepare the original die pads 204, 216 for addition of metallic layers to create a reconditioned die 324. Removal of the residues is commonly performed using various acid washes and rinses known in the art, and as previously described. Following removal of the residues and drying the original die pads 204, 216, flow proceeds to block 516.

At block 516, an electroless Nickel layer 316 is applied to each of the conditioned original die pads 204, 216. Application details of the electroless Nickel layer 316 were described in some detail with respect to FIG. 3C. Flow proceeds to block 520.

At block 520, an electroless Palladium layer 320 is applied to each of the die pads 204, 216, over the electroless Nickel layer 316. Application details of the electroless Palladium layer 320 were described in some detail with respect to FIG. 3D. Flow proceeds to block 524.

At block 524, an immersion Gold layer 328 is applied to each of the die pads 204, 216, over the electroless Palladium layer 320. Application details of the immersion Gold layer 328 were described in some detail with respect to FIG. 3E. Flow ends at block 524. With the completion of adding the immersion Gold layer 328, the die is now a reconditioned die 324 ready for assembly into a hermetic assembly 740.

Referring now to FIG. 5B, a flowchart illustrating a reconditioning process for an extracted die 200 in accordance with a second embodiment of the present invention is shown. This process converts an extracted die 200 (with original bond wires 212 and original ball bonds 208 removed) into a reconditioned die 324 of the present invention. Flow begins at block 532.

At block 532 a die 200 is extracted from a previous packaged integrated circuit. The previous package may be a hermetic or a non-hermetic package, and in either case is discarded and not reused. The extracted die 200 is a fully functional semiconductor die that will be utilized in a hermetic assembly 740. Flow proceeds to block 536.

At block 536, original bond wires 212 and original ball bonds 208 are removed from the extracted die 200 by conventional processes. Flow proceeds to block 540.

At block 540, only original die pads 204 that had original ball bonds 208 present are conditioned, and unbonded die pads 216 are not. Any metallic and/or chemical residues are removed from each of the original die pads 204 in order to prepare the original die pads 204 for addition of metallic layers to create a reconditioned die 324. Removal of the residues is commonly performed using various acid washes and rinses known in the art. Following removal of the residues and drying the original die pads 204, flow proceeds to block 544.

At block 544, an electroless Nickel layer 316 is applied to each of the original die pads 204. Application details of the electroless Nickel layer 316 were described in some detail with respect to FIG. 3C. Flow proceeds to block 548.

At block 548, an electroless Palladium layer 320 is applied to each of the die pads 204, over the electroless Nickel layer 316. Application details of the electroless Palladium layer 320 were described in some detail with respect to FIG. 3D. Flow proceeds to block 552.

At block 552, an immersion Gold layer 328 is applied to each of the original die pads 204, over the electroless Palladium layer 320. Application details of the immersion Gold layer 328 were described in some detail with respect to FIG. 3E. Flow ends at block 552. With the completion of adding the immersion Gold layer 328, the die is now a reconditioned die 324 ready for assembly into a hermetic assembly 740.

Referring now to FIG. 6, a diagram illustrating 3D printing a bond connection in accordance with embodiments of the present invention is shown. 3D printers are able to precisely deposit insulating or conducting material on complex shapes, and are able to build up or layer the insulating or conducting material to precise thicknesses.

The 3D printer includes a 3D printer material spray head 608, which applies bond insulator or conductor material 604 to selected areas of the bare die 100, extracted die 200, modified extracted die 312, or reconditioned die 324. 3D printers typically deposit material in layers, and build up a desired thickness of material by depositing multiple layers. The 3D printer is computer controlled equipment, and sprays material according to a file or files prepared beforehand designating specific locations that material will be applied to.

In one embodiment, the 3D printer uses an extrusion process to apply the bond insulating or conducting material 604. The extrusion process, sometimes referred to as Fused Deposition Modeling (FDM) uses a heated nozzle to extrude molten material.

In another embodiment, the 3D printer uses a Colorjet Printing (CJP) process to apply the bond insulating or conducting material 604. The CJP process utilizes an inkjet-based technology to spread fine layers of a dry substrate material. The dry substrate is most often in a powder form. The inkjet applies a binder to the substrate after applying the dry substrate material in order to solidify and cure the dry substrate.

In the preferred embodiment, the 3D printer uses a selective laser sintering process. The bond insulating or conducting material 604 is applied in powder form to the hermetic substrate 612, die pads 104, 204, 216, or 332, and hermetic substrate bond pads 616.

The bond insulator material 604 is a material able to be applied in powder form or extruded, and is generally a polymer or plastic. However, any material having suitable insulation properties, able to adhere to the hermetic substrate 612, die pads 104, 204, 216, or 332, and hermetic substrate bond pads 616, and able to be applied with a 3D printer material spray head 608 is suitable as bond insulator material 604.

The bond conductor material 604 is also a material able to be applied in powder form or extruded, and includes at least conductive metal and possibly polymer or plastic content in order to provide elastomeric or resilient properties. In the preferred embodiment, the metal content is silver. In other embodiments, the material may include alone or in combination gold, aluminum, or copper.

A sintering process is a second step of the 3D printing process used in the preferred embodiment of the invention, but is not specifically illustrated. A laser aims a laser beam at the applied bond insulating or conducting material 604 to convert the applied material 604 into 3D printed bond insulators 724 or 3D printed bond conductors 728, respectively. The laser beam converts the powder form applied material 604 into a molten compound with liquid properties that forms a smooth solid compound when it cools. The smooth solid compound is either 3D printed bond insulators 724 or 3D printed bond conductors 728.

Although an embodiment illustrating an extracted die 200 with original ball bonds 208 is shown, it should be understood that the present application includes other embodiments equally, including a bare die 100, a bare die 100 with conditioned die pads, a bare die 100 with reconditioned die pads 332, an extracted die 200 with conditioned die pads, and an extracted die 200 with reconditioned die pads 332.

Referring now to FIG. 7A, a diagram illustrating a top view of a die 100, 200 attached to a hermetic substrate 612 in accordance with embodiments of the present invention. The hermetic substrate 612 in most embodiments as a hermetic ceramic substrate, but in other embodiments may be another form of hermetic substrate such as a metallic substrate 612. The hermetic substrate 612 includes a hermetic substrate recess 716, which is slightly larger than die 100, 200, and slightly deeper than the thickness of die 100, 200. The hermetic substrate recess 716 provides a minimum of 1-3 mils of spacing between edges of the die 100, 200 and the hermetic substrate 612, in order to accommodate thermal coefficient of expansion mismatch between the die 100, 200 and the hermetic substrate 612. Preferably, the spacing is 20-50 mils. Hermetic substrate 612 includes a series of hermetic substrate first bond pads 708 generally in close proximity to hermetic substrate recess 716. Hermetic substrate 612 also includes a series of hermetic substrate second bond pads 712 generally in further proximity to hermetic substrate recess 716 then the first bond pads 708. In some embodiments, the number of hermetic substrate first bond pads 708 is equal to the number of hermetic substrate second bond pads 712. In other embodiments, the number of hermetic substrate first bond pads 708 is different than the number of hermetic substrate second bond pads 712.

The die may be either a bare die 100 or an extracted die 200, including die pads 104, 204, 216, 332. Therefore, if the die is an extracted die 200 with reconditioned die pads 332, the conditioning and reconditioning steps are performed prior to placing the extracted die 200 into the hermetic substrate recess 716.

Hermetic substrate first bond pads 708 are electrically connected to hermetic substrate second bond pads 712 with one or more conductive traces 704. In some embodiments, first and second bond pads 708, 712 are formed in the hermetic substrate 612 along with conductive traces 704 as part of creation or formation of the hermetic substrate 612. In other embodiments, first and second bond pads 708, 712 are formed in the hermetic substrate 612 as part of creation or formation of the hermetic substrate 612, but the conductive traces 704 are created as part of a follow-on processing step. For example, conductive traces 704 may be 3D printed bond connections 340. The 3D printed bond connections 340 may include only a 3D printed conductive layer 728 if the hermetic substrate itself 612 is non-conductive, in the case of most ceramic hermetic substrates 612. In other embodiments, the 3D printed bond connections 340 may also include a 3D printed insulating layer 724 if the hermetic substrate itself 612 is conductive, in the case of most metallic hermetic substrates 612.

Referring now to FIG. 7B, a diagram illustrating a top view of a hermetic substrate 612 side fill in accordance with embodiments of the present invention. In many embodiments, die 100, 200 is secured to the hermetic substrate 612 with a die attach adhesive (not shown). In other embodiments, the die 100, 200 is not secured to the hermetic substrate 612 with the die attach adhesive, but rather with a side fill compound 720. Prior to applying the side fill compound 720 to the hermetic substrate 612 the die 100, 200 should be centered within the hermetic substrate recess 716, and the top surface of the hermetic substrate 612 should be planer with the top surface of the die 100, 200. For example, a section of temporarily applied tape across the hermetic substrate 612 and die 100, 200 may maintain the planar relationship while the side fill compound 720 is being added to the hermetic substrate 612. Alternatively, a volume of die attach adhesive may be provided between the bottom of the hermetic substrate recess 716 and the bottom surface of the die 100, 200 in order to maintain the desired planar relationship.

The side fill compound 720 is a generally viscous material that secures the die 100, 200 to the hermetic substrate when the side fill compound 720 is cured. In some embodiments, the side fill compound 720 is an epoxy material. In some embodiments, the side fill compound 720 is applied to the hermetic substrate recess 716 with a 3D printer using a 3D printing process. When applying the side fill compound 720, it is important to maintain a planar relationship between the top surface of the hermetic substrate 612, the side fill compound 720, and a top surface of the die 100, 200. If the side fill compound 720 is allowed to fill to a height above the top surface of hermetic substrate 612 or die 100, 200, the side fill compound 720 may interfere with or cover die pads 104, 204, 216, 332 and/or hermetic substrate first bond pads 708.

Referring now to FIG. 7C, a diagram illustrating a top view of a hermetic substrate 612 after 3D printing bond insulators 724 in accordance with embodiments of the present invention. 3D printed bond insulators 724 prevent electrical conduction between 3D printed bond conductors 728 and conducting surfaces of the hermetic substrate 612 or die 100, 200 other than die pads 104, 204, 216, 332 or bond pads 708, 712. 3D Printed bond insulator 724 thickness can be less than 2 microns and is preferably 0.5-1 microns. Although FIG. 7C illustrates 3D printed bond insulators 724 between, but not covering, either die pads 104, 204, 216, 332 or bond pads 708, it should be understood that 3D printed bond insulators 724 may only be provided for some and not all 3D printed bond connections 340. Furthermore, 3D printed bond insulators 724 may be printed in small sections rather than continuously, as shown, depending on where electrical isolation is required.

The 3D printed bond insulator 724 includes a material able to be applied in powder form or extruded, and is generally a polymer or plastic. However, any material having suitable insulation properties, able to adhere to the die 100, 200 and hermetic substrate 612, and able to be applied with a 3D printer material spray head 608 is suitable as 3D printed bond insulator 724 material.

Referring now to FIG. 7D, a diagram illustrating a top view of a hermetic substrate 612 after 3D printing bond conductors 728 in accordance with embodiments of the present invention. 3-D printed bond conductors 728 provide electrical connection between die pads 104, 204, 216, 332 and hermetic substrate first bond pads 708. As such, where 3D printed bond insulators 724 are present, 3D printed bond conductors should be provided to a somewhat narrower width in order to prevent shorting to conductive surfaces in close proximity to 3D printed bond insulators 724. 3D printed bond conductor 728 thickness can be less than 2 microns and is preferably 0.5-1 microns The 3D printed bond conductor 728 includes a material able to be applied in powder form or extruded, and includes at least conductive metal and possibly polymer or plastic content in order to provide elastomeric or resilient properties. In the preferred embodiment, the metal content is silver. In other embodiments, the material may include alone or in combination any of gold, aluminum, or copper.

Referring now to FIG. 7E, a diagram illustrating a top view of a hermetic substrate 612 after 3D printing hermetic substrate encapsulation 732 in accordance with embodiments of the present invention. After the 3D printed bond conductors 728 have been provided between the die pads 104, 204, 216, 332 and hermetic substrate first bond pads 708, an encapsulation layer 732 is 3D printed over the die 100, 200, side fill compound 720, 3D printed bond conductors 728, and hermetic substrate first bond pads 708. This hermetically encapsulates the die 100, 200 and connecting circuitry, leaving hermetic substrate second bond pads 712 non-encapsulated in order to support secondary bonding operations. The hermetic encapsulation 732 is any hermetic material able to be 3D printed by 3D printer. Once encapsulated, the hermetic substrate 612 becomes a hermetic assembly 740, which may then be attached to other substrates or printed circuit boards as needed and as shown and described with reference to FIGS. 11A-11C. The 3D printed hermetic encapsulation 732 is any material able to be applied by 3D printer and providing a hermetic seal to the die 100, 200 and attached circuitry.

Referring now to FIG. 8, a flowchart illustrating an assembly process for a 3D printed hermetic substrate 612 in accordance with embodiments of the present invention is shown. Flow begins at block 804.

At block 804, a hermetic substrate 612 is fabricated. The hermetic substrate 612 may be fabricated from any hermetic material, including ceramic or metals. The hermetic substrate 612 includes a hermetic substrate recess 716 in a top surface of the hermetic substrate 612. The hermetic substrate recess 716 is a relieved portion of the hermetic substrate 612, and is slightly longer, wider, and deeper than a corresponding die 100, 200 intended to fit within the hermetic substrate recess 716. The hermetic substrate recess 716 also includes hermetic substrate first bond pads 708 and second bond pads 712 on the same side of the hermetic substrate 612 as the hermetic substrate recess 716. Flow proceeds to block 808.

At block 808, a die 100, 200 is secured within the hermetic substrate recess 716. In one embodiment, a die attach adhesive secures the die 100, 200. In one embodiment, the die attach adhesive is a hermetic die attach adhesive. When secured, the die 100, 200 top surface is planar with the top surface of the hermetic substrate 612, and the die 100, 200 is centered within the hermetic substrate recess 716. Flow proceeds to block 812.

At block 812, a side fill compound 720 is applied between the die 100, 200 and the hermetic substrate 612. For embodiments where a die attach adhesive secures the hermetic substrate 612 within the hermetic substrate recess 716, side fill compound fills spaces between side and bottom surfaces of the die 100, 200 and the hermetic substrate 612. In one embodiment, the side fill compound 720 is used in lieu of a die attach adhesive and secures the die 100, 200 to the hermetic substrate 612. Flow proceeds to optional block 816, optional block 820, and block 824.

At optional block 816, the hermetic substrate 612, die 100, 200, and side fill compound 720 may be vacuum baked in order to cure the side fill compound 720 and eliminate air pockets in the side fill compound 720 within hermetic substrate recess 716. Any suitable vacuum bake process known in the art may be used to cure the side fill compound 720, and manufacture instructions for curing the side fill compound 720 should be followed. One alternative vacuum bake process is illustrated and described with respect to FIG. 9. Flow proceeds to optional block 820 and block 824.

At optional block 820, if there are conductive surfaces on the die 100, 200 or hermetic substrate 612 that need to be bridged with an insulator, a 3D printer 3D prints bond insulators 724 between die pads 104, 204, 216, 332 and hermetic substrate first bond pads 708. For example, if hermetic substrate 612 is a metallic and electrically conductive substrate 612, bond insulators 724 should be 3D printed on surfaces of the hermetic substrate 612 between the die 100, 200 and the hermetic substrate first bond pads 708. Optional block 820 is not required if there are no conductive traces or other conductive surfaces that must be bridged prior to application of 3D printed bond conductors 728. Flow proceeds to block 824.

At block 824, a 3D printer prints bond conductors 728 connecting die pads 104, 204, 216, 332 to hermetic substrate first bond pads 708. If 3D printed bond insulators 724 were provided in block 820, the width of 3D printed bond conductors 728 should be controlled in order to be narrower than the width of 3D printed bond insulators 724 in order to prevent short-circuiting between 3D printed bond conductors 728 and other metallic traces or surfaces. Flow proceeds to block 828.

At block 828, a 3D printer encapsulates the hermetic package assembly 740 by 3D printing a hermetic encapsulation 732 over the die 100, 200, side fill compound 720, and hermetic substrate first bond pads 708. This leaves hermetic substrate second bond pads 712 unencapsulated in order to support secondary bonding operations as described in FIGS. 11A-11C.

At block 832, the hermetic assembly 740 is tested for hermeticity per MIL-SPEC-883H. Flow proceeds to block 836.

At block 836, the hermetic assembly 740 is electrically tested. Electrical testing includes either continuity tests or functional tests, or both. Flow ends at block 836.

Referring now to FIG. 9, a flowchart illustrating a vacuum bake process 816 in accordance with embodiments of the present invention is shown. The vacuum bake process is illustrative of many alternative vacuum baking processes known in the semiconductor arts, and it should be understood that other alternative vacuum bake processes may be used with equivalent success. Flow begins at block 904.

At block 904, prior to hermetic encapsulation (illustrated and described with reference to FIG. 7E), the hermetic substrate 612 (reflecting an assembly level shown and described as in FIG. 7D) is placed into a vacuum/pressure furnace. The vacuum/pressure furnace is equipment designed to present a predetermined thermal profile to one or more integrated circuits at a fixed or varying atmospheric pressure profile. Examples of vacuum/pressure furnaces are models 3130, 3140, and 3150 produced by Scientific Sealing Technologies International (SST). Flow proceeds to block 908.

At block 908, the internal temperature of the vacuum/pressure furnace is adjusted to a temperature of 200° C. or more. Flow proceeds to block 912.

At block 912, a baking timer is started. The baking timer measures elapsed time the hermetic substrate 612 is baking in the vacuum/pressure furnace. Flow proceeds to decision block 916.

At decision block 916, the baking timer is evaluated to determine if the hermetic substrate 612 has been baking for one hour, or more. If the hermetic substrate 612 has not been baking for at least one hour, then flow proceeds to decision block 916 to wait until at least one hour of baking time has elapsed. In a first embodiment, if the hermetic substrate 612 has been baking for at least one hour, then flow proceeds to block 924. In a second embodiment, if the hermetic substrate 612 has been baking for at least one hour, then flow proceeds to optional decision block 920.

At optional decision block 920, the vacuum/pressure furnace is evaluated to determine if a baking pressure of 20 milliTorr (mTorr) or less has been reached. Vacuum/pressure furnaces reduce the baking pressure from atmospheric (i.e., 1 atm) to pressures which can be orders of magnitude less than atmospheric pressure. Initially, the pressure is reduced rapidly, and later on, the pressure slowly decreases. Therefore, the specified target pressure (20 mTorr) is usually reached near the end of the baking time. If a baking pressure of 20 mTorr or less has not been reached, the flow proceeds to block 920 to wait until at least a baking pressure of 20 mTorr or less has been reached. If a baking pressure of 20 mTorr or less has been reached, the flow proceeds to block 924.

At block 924, the hermetic substrate 612 is removed from the vacuum/pressure furnace. The vacuum baking process is now completed. Flow proceeds to block 824 and optional block 820 of FIG. 8.

Referring now to FIG. 10A, a diagram illustrating a side view of a hermetic substrate 612 for mounting a die 100, 200 in accordance with embodiments of the present invention is shown. There hermetic substrate 612 includes a pocket relief 1004 in the hermetic substrate, which corresponds to the hermetic substrate recess 716 illustrated in FIG. 7A. the hermetic substrate 612 also includes first 708 and second 712 hermetic substrate bond pads. In some embodiments, conductive traces 704 are already present on the top surface of hermetic substrate 612, interconnecting selected first bond pads 708 with selected second bond pads 712. In other embodiments, conductive traces 704 are 3D printed by a 3D printer in a similar fashion to 3D printed bond conductors 728 illustrated in FIG. 7D.

Referring now to FIG. 10B, a diagram illustrating a side view of a die 100, 200 mounted to a hermetic substrate 612 in accordance with embodiments of the present invention is shown. In one embodiment, die 100, 200 is secured within the pocket relief 1004 with a die attach adhesive 1008. The die 100, 200 should be centered within the pocket relief 1004, and configured such that the top surface of the die 100, 200 is in the same plane as a top surface of the hermetic substrate 612, where the first and second bond pads 708, 712 are located.

Referring now to FIG. 10C, a diagram illustrating a side view of a side fill compound 720 applied to a hermetic substrate 612 in accordance with embodiments of the present invention is shown. The side fill compound 720 is a viscous non-conducting compound that fills empty areas of the pocket recess 1004 between the die 100, 200 and the hermetic substrate 612. In one embodiment, the side fill compound 720 fills areas up to, but not including, the die attach adhesive 1008. In another embodiment, the side fill compound 720 fills all areas to the sides and beneath the die 100, 200 within the pocket recess 1004. In this case, a die attach adhesive 1008 is not used in the side fill compound 720 to occupy space that a die attach adhesive 1008 would have occupied. However, the same centering and planarity requirements exist between the die 100, 200 and the hermetic substrate 612 regardless of whether a die attach adhesive 1008 is used, or not.

Referring now to FIG. 10D, a diagram illustrating a side view of 3D printed bond connections 340 in accordance with embodiments of the present invention is shown. FIG. 10D assumes the side fill compound 720 and/or die attach adhesive 1008 have been cured beforehand. A vacuum bake process known in the art should be used to cure the side fill compound 720 or die attach adhesive 1008, according to manufacturer instructions. Once the side fill compound 720 or die attach adhesive 1008 have cured, a 3-D printer prints bond connections 340 between die pads 104, 204, 216, 332 and hermetic substrate first bond pads 708. In some embodiments such as described with reference to FIG. 7C, 3D printed bond insulators 724 are applied by 3D printer prior to the 3D printer printing bond connections 340.

Referring now to FIG. 10E, a diagram illustrating a side view of hermetic encapsulation in accordance with embodiments of the present invention is shown. After the 3D printer prints the bond connections 340 (which include 3D printed bond insulators 724, if required, and 3D printed bond conductors 728), a 3D printer prints hermetic encapsulation 732 over the die 100, 200, side fill compound 720, and hermetic substrate first bond pads 708. At this point, the complete device is a hermetic assembly 740.

Referring now to FIG. 11A, a diagram illustrating a side view of a hermetic assembly 740 mounting in accordance with embodiments of the present invention is shown. The hermetic assembly 740 may itself be used within various environments and other assemblies, including both hermetic and non-hermetic environments. However, hermetic assembly 740 is by itself hermetic integrated circuit. Typically, the hermetic assembly 740 is secured to another substrate or a printed circuit board 1104 with an adhesive 1108. The adhesive may be a die attach adhesive 1008 as previously described, or a solder compound or an epoxy as known in the art.

Referring now to FIG. 11B, a diagram illustrating a side view of a hermetic device mounting in accordance with a first embodiment of the present invention is shown. In the embodiment illustrated in FIG. 11B, an environment is illustrated where the hermetic assembly 740 is secured to the substrate or printed circuit board 1104 with conventional wire bonding techniques. Bond wires 1120 are provided between hermetic substrate second bond pads 712 and bond pads 1112 on the substrate or printed circuit board 1104. In some embodiments, second bond pads 712 and/or bond pads 1112 are reconditioned as shown and described with reference to FIGS. 3A-3F in order to provide an improved bonding surface for bond wires 1120.

Referring now to FIG. 11C, a diagram illustrating a side view of a hermetic device mounting in accordance with a second embodiment of the present invention is shown. The embodiment illustrated in FIG. 11C, a 3D printer applies 3D printed bond connections 340 (which include 3D printed bond insulators 724, if required, and 3D printed bond conductors 728), between the hermetic substrate second bond pads 712 and the substrate or printed circuit board bond pads 1112. This may provide an improved process to that shown in FIG. 11B since 3D printed bond connections 340 are not weakened by vibration and shock as bond wires 1120 may be. Additionally, 3D printed bond connections 340 may not be susceptible to inter-metallic degradation and bond pad 712, 1112 interfaces as conventional ball bonds 1116 and bond wires 1120 are.

Referring now to FIG. 12, a flowchart illustrating an assembly process for a completed assembly in accordance with embodiments of the present invention is shown. Flow begins at block 1204.

At block 1204, an adhesive is applied to a bottom surface of hermetic assembly 740 or a substrate/printed circuit board 1104. The adhesive may be a die attach adhesive 1008, or other form of epoxy or solder compound known in the art. Flow proceeds to block 1208.

At block 1208, the hermetic assembly 740 is secured to the substrate or printed circuit board 1104. Flow proceeds to optional blocks 1212 and 1216.

At optional block 1212, bond wires 1120 are provided between hermetic substrate second bond pad 712 in bond pads 1112 of the substrate or printed circuit board 1104. The bond wires 1120 are provided using known processes including thermosonic or wedge bonding. Block 1212 is mutually exclusive of block 1216, and either block 1212 or 1216 is used to bond the hermetic assembly 704 to the substrate or printed circuit board 1104. Flow proceeds to block 1220.

At optional block 1216, a 3-D printer prints bond connections 340 between the hermetic assembly 740 and the substrate or printed circuit board 1104. Specifically, 3D printed bond conductors 728 and possibly 3D printed bond insulators 724, if required, are provided between hermetic substrate second bond pad 712 and bond pads 1112 of the substrate or printed circuit board 1104. Block 1216 is mutually exclusive of block 1212, and either block 1216 or 1212 is used to bond the hermetic assembly 704 to the substrate or printed circuit board 1104. Flow proceeds to block 1220.

At block 1220, the completed assembly is tested for hermeticity per MIL-SPEC-883H. Flow proceeds to block 1224.

At block 1224, the completed assembly is electrically tested. Electrical testing includes either continuity tests or functional tests, or both. Flow ends at block 1224.

Finally, those skilled in the art should appreciate that they can readily use the disclosed conception and specific embodiments as a basis for designing or modifying other structures for carrying out the same purposes of the present invention without departing from the spirit and scope of the invention as defined by the appended claims.

It will be readily understood that the components of the application, as generally described and illustrated in the figures herein, may be arranged and designed in a wide variety of different configurations. Thus, the detailed description of the embodiments is not intended to limit the scope of the application as claimed, but is merely representative of selected and exemplary embodiments of the application.

One having ordinary skill in the art will readily understand that the application as discussed above may be practiced with steps in a different order, and/or with hardware elements in configurations that are different than those which are specifically disclosed. Therefore, although the application has been described based upon these preferred embodiments, it would be apparent to those of skill in the art that certain modifications, variations, and alternative constructions would be apparent, while remaining within the spirit and scope of the application. In order to determine the metes and bounds of the application, therefore, reference should be made to the present claims.

While preferred embodiments of the present application have been described, it is to be understood that the embodiments described are illustrative only and the scope of the application is to be defined solely by the appended claims when considered with a full range of equivalents and modifications (e.g., protocols, hardware devices, software platforms etc.) thereto.

I claim:

1. A method comprising:
    removing existing ball bonds from an extracted die, the extracted die comprising a fully functional semiconductor die removed from a previous package;
    placing the extracted die into a recess of a hermetic substrate, the hermetic substrate comprising first bond pads coupled to second bond pads, the extracted die having a centered orientation in the recess;
    applying a side fill compound into the recess between the extracted die and the hermetic substrate;
    3D printing, by a 3D printer, a plurality of bond connections between die pads of the extracted die and the first bond pads in order to create a 3D printed die substrate; and
    3D printing a hermetic encapsulation over the extracted die, the side fill compound, and the 3D printed bond connections in order to create a hermetic assembly, wherein the 3D printed hermetic encapsulation does not cover the second bond pads.

2. The method of claim 1, further comprising:
vacuum baking the 3D printed die substrate in order to cure, and eliminate air pockets from, the side fill compound.

3. The method of claim 2, wherein a top surface of the extracted die being planar with a top surface of the hermetic substrate, wherein applying the side fill compound comprising:
maintaining a planar relationship with the side fill compound between the top surface of the extracted die and the top surface of the hermetic substrate.

4. The method of claim 2, further comprising:
securing the hermetic assembly to one of a printed circuit board or a different substrate; and
providing bond connections or bond wires between the second bond pads and package leads, downbonds, or bond pads of the printed circuit board or the different substrate.

5. The method of claim 2, wherein prior to placing the extracted die into the recess, the method further comprising:
applying a die attach adhesive between the extracted die and the hermetic substrate to secure the extracted die to the hermetic substrate.

6. The method of claim 2, wherein 3D printing the plurality of bond connections comprising, for each bond connection:
3D printing, by the 3D printer, a bond insulator at least to conductive surfaces of the extracted die between a die pad and a first bond pad; and
3D printing a bond conductor over the bond insulator, the 3D printed bond conductor providing electrical contact between the die pad and the first bond pad.

7. The method of claim 6, further comprising:
not 3D printing the bond insulator if there are not conductive surfaces between the die pad and the first bond pad.

8. The method of claim 2, wherein the hermetic substrate comprises second bond pads electrically connected to the first bond pads by conductive traces.

9. The method of claim 8, further comprising:
3D printing, by the 3D printer, the conductive traces.

10. A method, comprising:
removing an extracted die from a previous integrated circuit package, the extracted die comprising a fully functional semiconductor die with one or more ball bonds on one or more die pads and no bond wires coupled to the one or more ball bonds;
placing the extracted die into a recess of a hermetic substrate, the extracted die having a centered orientation in the recess;
applying a side fill compound into the recess between the extracted die and the hermetic substrate, the hermetic substrate comprising first bond pads coupled to second bond pads;
3D printing, by a 3D printer, a plurality of bond connections between die pads of the extracted die and first bond pads of the hermetic substrate in order to create a 3D printed die substrate; and
3D printing a hermetic encapsulation over the extracted die, the side fill compound, and the 3D printed bond connections in order to create a hermetic assembly, wherein the 3D printed hermetic encapsulation does not cover the second bond pads.

11. The method of claim 10, wherein 3D printing the plurality of bond connections comprising:
3D printing, by the 3D printer, a plurality of bond conductors between the die pads and the first bond pads, one or more 3D printed bond conductors conformal to and covering the one or more ball bonds.

12. The method of claim 10, wherein the extracted die comprises a modified extracted die comprising no ball bonds on die pads of the extracted die.

13. The method of claim 12, wherein the modified extracted die comprises reconditioned die pads, wherein reconditioning die pads comprising:
removing metallic residue and chemical deposits from the surface of the die pads;
applying a nickel layer direct over the die pads;
applying a palladium layer over the nickel layer; and
applying a gold layer over the palladium layer.

14. The method of claim 13, wherein only die pads of the modified extracted die corresponding to die pads of the extracted die previously having a ball bond are reconditioned.

15. The method of claim 13, further comprising:
vacuum baking the 3D printed die substrate in order to cure, and eliminate air pockets from, the side fill compound.

16. The method of claim 15, wherein a top surface of the modified extracted die is planar with a top surface of the hermetic substrate, wherein applying the side fill compound comprising:
maintaining a planar relationship with the side fill compound between the top surface of the modified extracted die and the top surface of the hermetic substrate.

17. The method of claim 15, wherein 3D printing the plurality of bond connections comprising, for one or more bond connections:
3D printing, by the 3D printer, a bond insulator at least to conductive surfaces of the die between a die pad and a first bond pad; and
3D printing a bond conductor over the bond insulator, the 3D printed bond conductor providing electrical contact between the die pad and the first bond pad.

18. The method of claim 17, further comprising:
not 3D printing the bond insulator if there are not conductive surfaces between the die pad and the first bond pad.

19. The method of claim 15, wherein the hermetic substrate comprises second bond pads electrically connected to the first bond pads by conductive traces.

20. The method of claim 19, wherein further comprising:
3D printing, by the 3D printer, the conductive traces.

* * * * *